(12) United States Patent
Ye et al.

(10) Patent No.: US 7,587,704 B2
(45) Date of Patent: Sep. 8, 2009

(54) SYSTEM AND METHOD FOR MASK VERIFICATION USING AN INDIVIDUAL MASK ERROR MODEL

(75) Inventors: Jun Ye, Palo Alto, CA (US); Stefan Hunsche, Sunnyvale, CA (US)

(73) Assignee: Brion Technologies, Inc., Santa Clara, CA (US)

( * ) Notice: Subject to any disclaimer, the term of this patent is extended or adjusted under 35 U.S.C. 154(b) by 419 days.

(21) Appl. No.: 11/530,402

(22) Filed: Sep. 8, 2006

(65) Prior Publication Data

US 2007/0061772 A1   Mar. 15, 2007

Related U.S. Application Data

(60) Provisional application No. 60/719,837, filed on Sep. 9, 2005.

(51) Int. Cl.
G06F 17/50   (2006.01)
G03F 1/00    (2006.01)
G21K 5/00    (2006.01)

(52) U.S. Cl. .................. 716/21; 716/19; 430/5; 378/35

(58) Field of Classification Search .......... 716/19, 716/21; 430/5
See application file for complete search history.

(56) References Cited

U.S. PATENT DOCUMENTS

| | | | |
|---|---|---|---|
| 6,091,845 A | 7/2000 | Pierrat et al. | |
| 6,516,085 B1 | 2/2003 | Wiley et al. | |
| 6,803,554 B2 | 10/2004 | Ye et al. | |
| 6,806,456 B1 | 10/2004 | Ye et al. | |
| 6,828,542 B2 | 12/2004 | Ye et al. | |
| 6,884,984 B2 | 4/2005 | Ye et al. | |
| 6,934,930 B2 | 8/2005 | Blatchford et al. | |
| 7,003,758 B2 | 2/2006 | Ye et al. | |
| 2003/0194618 A1* | 10/2003 | Hoga et al. | 430/5 |
| 2004/0133369 A1* | 7/2004 | Pack et al. | 702/59 |
| 2004/0225488 A1 | 11/2004 | Wang et al. | |
| 2006/0190196 A1* | 8/2006 | Rankin | 702/42 |
| 2006/0206853 A1* | 9/2006 | Kamo et al. | 716/19 |
| 2007/0031745 A1 | 2/2007 | Ye et al. | |
| 2007/0207393 A1* | 9/2007 | Ikenaga | 430/5 |
| 2007/0233419 A1* | 10/2007 | Pack et al. | 702/127 |

OTHER PUBLICATIONS

C. Spence "Full Chip Lithography Simulation and Design Analysis—How OPC is Changing IC Design" Proc. SPIE vol. 5751, pp. 1-14 (2005).
P. Martin et al. "Exploring New High Speed, Mask Aware RET Verification Flows" Proc. SPIE vol. 5853, pp. 114-123 (2005).
Y. Cao et al. "Optimized Hardware and Software for Fast, Full Chip Simulation" Proc. SPIE vol. 5754, pp. 407-414 (2005).
A.J. Merriam et al. "Optical Considerations of High-Resolution Photomask Phase Metrology" Proc. SPIE vol. 5752, pp. 1392-1401 (2005).
Zait et al. "CD Variations Correction by Local Transmission Control of Photomasks Done With a Novel Laser Based Process" Proc. SPIE vol. 6152, pp. 615225-1-615225-6 (2006).

* cited by examiner

*Primary Examiner*—Thuan Do
*Assistant Examiner*—Magid Y Dimyan
(74) *Attorney, Agent, or Firm*—Pillsbury Winthrop Shaw Pittman LLP

(57) ABSTRACT

Methods and systems are disclosed to inspect a manufactured lithographic mask, to extract physical mask data from mask inspection data, to determine systematic mask error data based on differences between the physical mask data and mask layout data, to generate systematic mask error parameters based on the systematic mask error data, to create an individual mask error model with systematic mask error parameters, to predict patterning performance of the lithographic process using a particular mask and/or a particular projection system, and to predict process corrections that optimize patterning performance and thus the final device yield.

17 Claims, 17 Drawing Sheets

SYSTEM AND METHOD FOR MASK VERIFICATION USING AN INDIVIDUAL MASK ERROR MODEL

CROSS-REFERENCE TO RELATED APPLICATION

This application claims the benefit of U.S. Provisional Patent Application No. 60/719,837, entitled "System and Methods for Model-Based Mask Verification." The subject matter of this related application is hereby incorporated by reference in its entirety.

FIELD OF THE INVENTION

This invention relates generally to optical lithography and more particularly to mask verification using an individual mask error model.

BACKGROUND

The integrated circuit industry has, since its inception, maintained a remarkable growth rate by driving increased device functionality at lower cost. Leading edge devices today provide the computing power of computers that used to occupy entire rooms at a mere fraction of the cost. Many of today's low-cost consumer devices include functionality that only a few years ago was unavailable at any cost, such as video cell phones, ultra-portable media players, and wireless or ultra-wideband Internet devices. One of the primary enabling factors of this growth has been the ability of optical lithography processes to steadily decrease the smallest feature size that can be patterned as part of an integrated circuit pattern. This steady decline in feature size and cost while at the same time printing more features per circuit is commonly referred to as "Moore's Law" or the lithography "roadmap."

The lithography process involves creating a master image on a mask then replicating that pattern faithfully onto the device wafers. The more times a master pattern is successfully replicated within the design specifications, the lower the cost per finished device or "chip." Until recently, the mask pattern has been an exact duplicate of the desired pattern at the wafer level, with the exception that the mask level pattern may be several times larger than the wafer level pattern. This scale factor is then corrected during wafer exposure by the reduction ratio of the exposure tool. The mask pattern is typically formed by depositing and patterning a light-absorbing material on a quartz or other transmissive substrate. The mask is then placed in an exposure tool known as a "stepper" or "scanner" where light of a specific exposure wavelength is directed through the mask onto the device wafers. The light is transmitted through the clear areas of the mask and attenuated by a desired amount, typically between 90% and 100%, in the areas that are covered by the absorbing layer. The light that passes through some regions of the mask may also be phase-shifted by a desired phase angle, typically an integer multiple of 180 degrees. After being collected by the exposure tool, the resulting aerial image pattern is then focused onto the device wafers. A light sensitive material deposited on the wafer surface interacts with the light to form the desired pattern on the wafer, and the pattern is then transferred into the underlying layers on the wafer to form functional electrical circuits according to well-known processes.

In recent years, the feature sizes being patterned have become significantly smaller than the wavelength of light used to transfer the pattern. This trend towards "sub-wavelength lithography" has resulted in increasing difficulty in maintaining adequate process margins in the lithography process. The aerial images created by the mask and exposure tool lose contrast and sharpness as the ratio of feature size to wavelength decreases. This ratio is quantified by the k1 factor, defined as the numerical aperture of the exposure tool times the minimum feature size divided by the wavelength. Currently, the practical flexibility in choosing the exposure wavelength is limited, and the numerical aperture of exposure tools is approaching physical limits. Consequently, the continuous reduction in device feature sizes requires more and more aggressive reduction of the k1 factor in lithographic processes, i.e., imaging at or below the classical resolution limits of an optical imaging system.

New methods to enable low-k1 lithography have resulted in master patterns on the mask that are not exact copies of the final wafer level patterns. The mask pattern is often adjusted in terms of the size and the location of the pattern as a function of pattern density or pitch. Other techniques involve the addition or subtraction of extra corners on the mask pattern ("serifs," "hammerheads," and other patterns), and even the addition of geometries that will not be replicated on the wafer. These non-printing "assist features" may include scattering bars, holes, rings, checkerboards, or "zebra stripes" to change the background light intensity ("gray scaling"), and other structures, which are well documented in the literature. All of these methods are often referred to collectively as "Optical Proximity Correction," or "OPC." With decreasing k1, the magnitude of proximity effects increases dramatically. In current high-end designs, more and more device layers require OPC, and almost every feature edge requires some amount of adjustment in order to ensure that the printed pattern will reasonably resemble the design intent. The implementation and verification of such extensive OPC application is only made possible by detailed full-chip computational lithography process modeling, and the process is generally referred to as model-based OPC. (See "Full-Chip Lithography Simulation and Design Analysis—How OPC Is Changing IC Design," C. Spence, Proc. SPIE, Vol. 5751, pp. 1-14 (2005) and "Exploring New High Speed, Mask Aware RET Verification Flows," P. Martin et al., Proc. SPIE 5853, pp. 114-123, (2005)).

The mask may also be altered by the addition of phase-shifting regions that may or may not be replicated on the wafer. Many phase-shifting techniques have been described at length in the literature, including alternating aperture shifters, double expose masking processes, multiple phase transitions, and attenuating phase-shifting masks. Masks formed by these methods are known as "Phase-Shifting Masks," or "PSMs." All of these techniques to increase image slope and contrast at low-k1, including OPC, PSM, and others, are referred to collectively as "Resolution Enhancement Technologies," or "RETs." The result of all of these RETs, which are often applied to the mask in various combinations, is that the final pattern formed at the wafer level is no longer a simple replicate of the mask level pattern. In fact, it is becoming impossible to look at the mask pattern and simply determine what the final wafer pattern is supposed to look like. This greatly increases the difficulty in verifying that the design data is correct before the mask is made and wafers are exposed as well as in verifying that the RETs have been applied correctly and that the mask meets its target specifications.

The proliferation of OPC and other RETs results in a number of considerable challenges. In particular, a post-OPC mask design bears very limited resemblance to the pre-OPC design intent, i.e., the semiconductor structures intended to be manufactured. Even more challenging is a reduction of process windows, i.e., the tolerance of the lithographic process against unintended variations of certain parameters such as exposure dose and focus that accompanies the reduction of k1 factors. Furthermore, as proximity effects are getting more pronounced, the exact behavior of a feature under small changes of process parameters becomes extremely nonlinear and often non-intuitive. Even minor undetected process variations may have significant unpredicted impact on device yields. Such yield loss will most likely occur at "weak points" or "hot spots" of a design and is thus qualitatively different from yield loss resulting from random "point defects" caused by, e.g., mask contamination. At the current state of semiconductor manufacturing, it appears that device yield is increasingly limited by design weaknesses rather than by random defects.

A major contribution to systematic process variations that may push a weak design feature into failure are the exact physical properties of the mask itself. Relevant physical mask parameters may include line-width biases, corner rounding, pitch dependencies due to mask-write or mask-etch proximity effects, anisotropies, phase errors, polarization, birefringence, or in general "3-D mask effects." These parameters may vary within the area of a single mask, between masks manufactured at different times, masks manufactured on different tools, or masks from different mask shops.

While the OPC and mask design is based on detailed models, the actual physical properties of the mask may differ from the assumptions of the model and thereby may shift process windows and optimum process conditions or cause unexpected yield loss. Such yield loss may occur at previously identified hot spots. However, unanticipated and undetected variations in physical mask parameters may also considerably change the severity of hot spots or even lead to failure of patterns that would not be identified as "marginal" (or "weak") under nominal conditions. (A "marginal" or "weak" pattern is a pattern that may easily result in failure or yield loss due to, e.g., manufacturing uncertainties or process variations.)

Traditional mask inspection focuses on detecting isolated point defects such as dust particles or pinholes on the mask and thus cannot detect a mask's systematic errors and their impact on process-window related "design defects" or "hot spots." FIG. 1 is a flowchart of method steps for a prior-art manufacturing process, in which such traditional mask inspection occurs in step 120. In step 110, the pre-OPC design layout showing the design intent for a chip is produced. Then, in step 112, the pre-OPC design layout is processed using OPC and other RETs to produce a post-OPC mask layout. In step 114, the full chip is simulated using a model of the lithography process and a nominal mask error model applied to the post-OPC mask layout to predict the printed patterns. An example of simulating a lithography process using such a lithography process model and mask model is disclosed in "System and Method for Lithography Simulation," U.S. Pat. No. 7,003,758 (the '758 patent), the subject matter of which is hereby incorporated by reference in its entirety. In step 116, the pre-OPC design layout, i.e., the design intent, is compared against the predicted printed patterns to determine if the post-OPC mask layout is acceptable. If so, the method continues in step 118; if not, the method returns to step 112, where the comparison results from step 116 will be used to tune the post-OPC mask layout to produce a new post-OPC mask layout, and then steps 114 and 116 will be repeated. Once the predicted printed patterns are determined to be acceptable, then the method continues in step 118, in which a mask is manufactured according to the acceptable post-OPC mask layout. Then, in step 120, the mask is inspected to identify isolated point defects such as dust particles or pinholes. In step 122, the identified point defects are evaluated to determine if the manufactured mask is acceptable. If so, the method continues in step 128; if not, the method continues in step 124, in which the mask is evaluated to determine if it is repairable. If the mask is repairable, the method continues in step 126, in which the mask is repaired, and then the method returns to step 120; if the mask is not repairable, then the method returns to step 118, in which a new mask will be manufactured. In optional step 128, the lithography process is tuned using information from the simulations of step 114. Such information may include hot spot reports for targeted wafer inspection or optimized process conditions. However, since the simulations during the design phase are based on nominal conditions (in particular, nominal values for the mask error model parameters), the effectiveness of such feed-forward information will be limited. In step 130, wafers are printed using the manufactured (and maybe also repaired) mask.

As indicated in FIG. 1, a prior art device manufacturing process proceeds from a pre-OPC design layout that defines the desired functionality of a device to a post-OPC mask layout by applying OPC or other RETs. This process of converting a pre-OPC design layout into a post-OPC mask layout currently relies heavily on numerical simulation of the lithography process (e.g., model-based OPC and model-based design verification) and may typically require several iterations before a design is considered acceptable. Full-chip simulation is required to ensure that all elements of the device will print on the wafer as intended. The simulation for OPC generation and design verification may, e.g., use a lithography simulation system as described in the '758 patent, which can predict printed resist or feature contours from a mask layout, taking into account the optical properties of the projection process as well as the properties of the resist layer on a production wafer.

Once the mask layout is determined to be acceptable, a physical mask will be manufactured by a mask shop and delivered to the fab. This mask may be inspected using existing mask inspection tools in order to detect and possibly repair any point defects due to, e.g., any contamination during mask manufacturing. Subsequently, the mask will be loaded into an exposure tool to print production wafers. Notably, while detailed simulation models are a central part of the mask design process, traditionally no model-based information is utilized in the overall lithographic device manufacturing process once the mask has been made. In practice, this situation often leaves the mask manufacturing process open to considerable uncertainties (e.g., whether OPC has been properly implemented on the actual mask). For any new mask, there may also be a need to adjust empirically—essentially by trial-and-error—process parameters in order to produce, e.g., printed line-widths close enough to the design target. Consequently, if any systematic mask errors have been introduced in the mask manufacturing process, it may take a long time and a large number of printed wafers before such errors can be unambiguously detected and corrected.

As a result, there exists a strong need for systems and methods that verify the physical properties of actual lithographic masks and their effects on the pattern printing process, taking into account the design intent. Such methods would enable a predictive and proactive qualification of masks before exposing any wafers and would also enable adjustments or process corrections to optimize printed device yield for a given physical mask. Such process corrections may be identified by accurate modeling and may, for example, involve adjustments of exposure dose, focus offsets, NA-sigma settings, choices among different exposure tools, and, when systematic mask error repair technology is available, feedback to a mask manufacturing process to repair the systematic mask errors.

SUMMARY

Methods and systems are disclosed to inspect a manufactured lithographic mask, to extract physical mask data from mask inspection data, to generate systematic mask error data using the physical mask data, to create an individual mask error model with systematic mask error parameters based on the systematic mask error data, to verify mask and OPC quality, to predict patterning performance of the lithographic process using a particular mask and/or a particular projection system, and to predict process corrections that optimize patterning performance and thus the final device yield.

In one embodiment, a method for creating an individual mask error model includes obtaining mask inspection data from a mask manufactured using mask layout data, determining differences between the mask inspection data and the mask layout data, generating systematic mask error data based on the differences between the mask inspection data and the mask layout data, and generating systematic mask error parameters for an individual mask error model based on the systematic mask error data.

In one embodiment, a system for creating an individual mask error model includes a mask inspection tool configured to produce mask inspection data, and a model-based mask data analysis system that is configured to extract physical mask data from the mask inspection data, to determine systematic mask error data based on differences between the extracted physical mask data and mask layout data, and configured to generate systematic mask error parameters for an individual mask error model using the systematic mask error data.

DETAILED DESCRIPTION OF THE INVENTION

Figure 1:
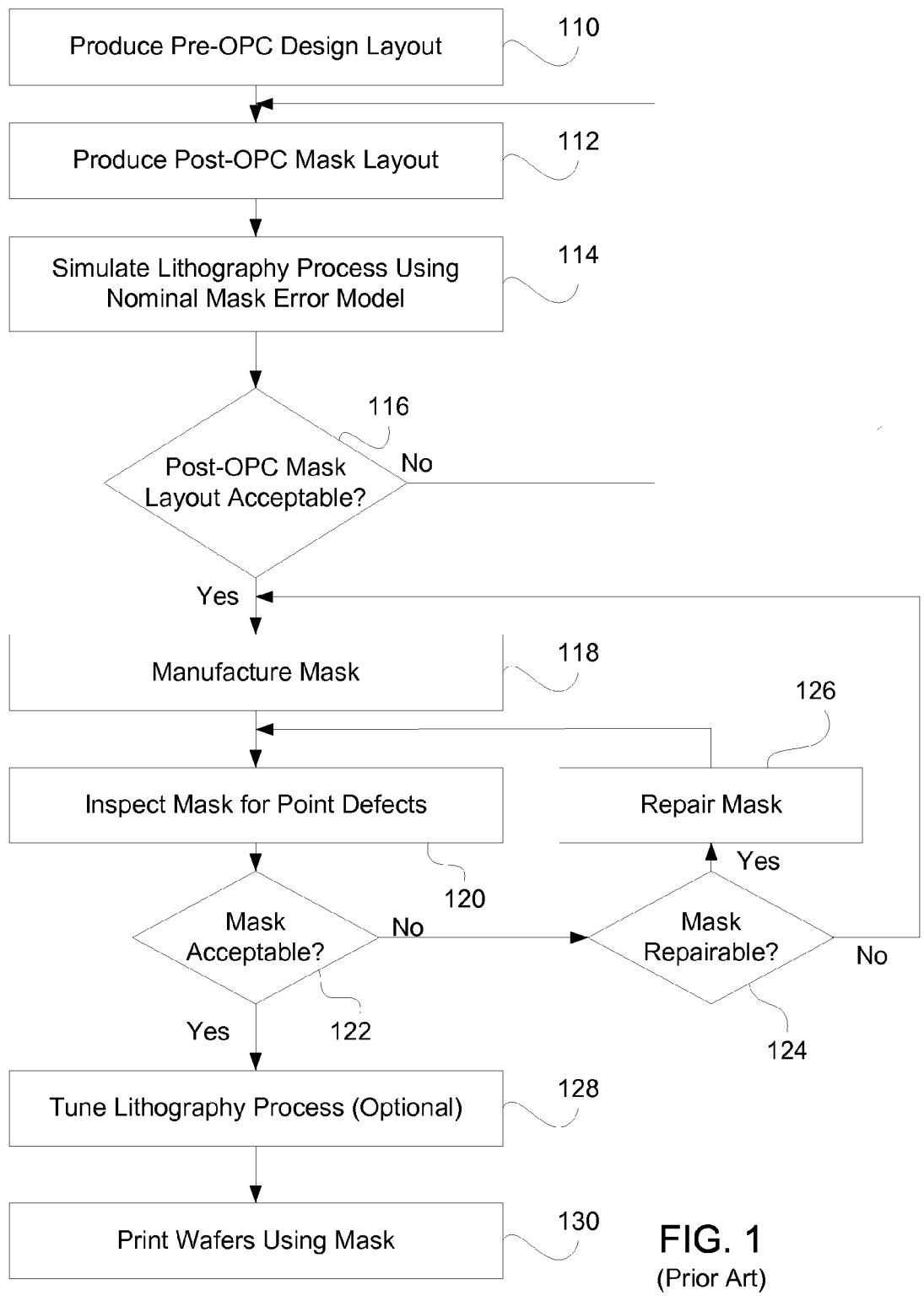
FIG. 1 is a flowchart of a prior art lithographic design and manufacturing process.

In practice, errors (or defects, used interchangeably from here on) are always introduced into final manufactured masks during the pattern transfer process from the post-OPC mask layout to the actual pattern on the mask due to imperfections of the mask manufacturing tool and variations of the mask manufacturing process. Mask errors are the differences between the manufactured mask pattern and the ideal post-OPC mask layout that is intended to be made on the mask. Mask errors generally fall into two categories: random mask errors and systematic mask errors. Random mask errors are errors that cannot be described by a model, but appear randomly and statistically in a manufactured mask, for example, excess particles and pin-holes. Systematic mask errors are errors that can be described by a model, where the model depends on pattern environment (e.g., local pattern density, pattern size, pattern spacing, and pattern orientation) and/or pattern location on the mask. The dependency on pattern environment is caused by, for example, mask writer e-beam proximity effects, e-beam fogging effects, etching loading effects, and e-beam induced substrate heating effects. The dependency on pattern location is caused by, for example, slow drifting of the mask writer during the mask writing process and post-exposure bake temperature non-uniformity. The model that describes the systematic mask errors is called a "mask error model" or sometimes simply a "mask model." The mask error model takes in as input the pattern environment and pattern location on a mask, and outputs mask error values, e.g., CD error, line-edge roughness, placement error, etch depth error and side-wall angle error for phase-shifting mask, etc. The CD error is the linewidth difference between the manufactured mask pattern and the ideal post-OPC mask layout. The placement error is the pattern center location difference between the manufactured mask pattern and the ideal post-OPC mask layout pattern. The etch depth error is the trench depth difference between the manufactured phase-shifting mask pattern and the design intended trench depth into mask substrate that will provide necessary phase-shifting when the light beam passes through a mask. The line edge roughness is the deviation of a line edge from a smooth, ideal shape. The side-wall angle error is the angle difference between the line edge profile of the manufactured mask and the ideal vertical line edge profile. A mask manufacturing process has a nominal mask error model that describes the process-induced average mask errors, for example, corner rounding and pattern bias. Each individual physical mask's systematic error deviates from the nominal mask error model. The individual mask's systematic error is described by an individual mask error model, as disclosed herein. In one embodiment, the individual mask error model is developed empirically, e.g., by fitting experimentally-measured corner rounding and bias compared with the pattern environment and pattern location. In another embodiment, the individual mask error model is developed using first-principal physical process simulations of the mask manufacturing process, e.g., simulating the electron trace inside a mask substrate, simulating the resist-to-electron interactions, and simulating the resist's chemical process during resist development.

In order to determine mask errors and create an individual mask error model, each manufactured mask is measured by an inspection tool or a metrology tool to obtain mask inspection data. The mask inspection data, however, do not necessarily represent perfectly the manufactured physical mask data that are needed to determine mask errors. Errors and distortions are introduced into the mask inspection data by the inspection tool or metrology tool as the result of the non-ideal measurement transfer function of the tool. Therefore, in order to accurately predict or measure physical mask data on a manufactured mask, in one embodiment calibrated models of the inspection or metrology tools, for example, an optical model for an optical inspection tool, are applied to extract the physical mask data of the manufactured mask from the inspection or metrology tool output. The differences between the extracted physical mask data from the mask inspection data and the post-OPC mask layout data are designated as the systematic mask error data. In one embodiment, the systematic mask error parameters are then generated by fitting the systematic mask error data to input variables of the mask error model such as the pattern environment and pattern location on a mask. An individual mask error model is finally created by applying the systematic mask error parameters to the mask error model.

Figure 2A:
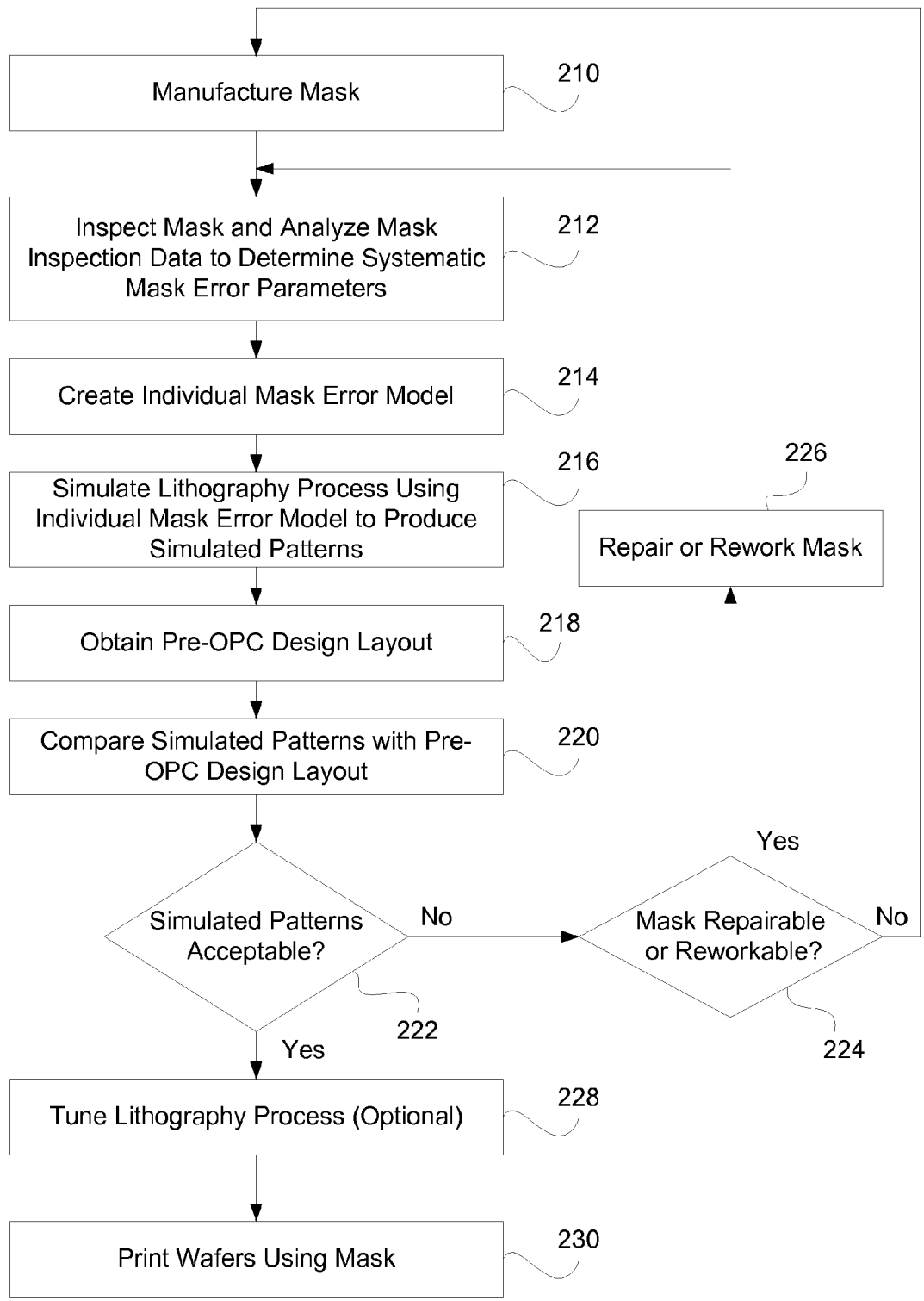
FIG. 2A is a flowchart of method steps for mask verification using an individual mask error model, according to one embodiment of the invention.

FIG. 2A is a flowchart of method steps for mask verification using an individual mask error model, according to one embodiment of the invention. In step 210, a mask is manufactured according to an acceptable post-OPC mask layout. In step 212, the mask is inspected using any of a number of possible metrology tools, as discussed in more detail below, to produce mask inspection data. The mask inspection data is analyzed to extract systematic mask error data for the mask and systematic mask error parameters are then determined from the systematic mask error data. In step 214, an individual mask error model is created for the specific mask that was inspected. The individual mask error model includes systematic mask error parameters based on the extracted systematic mask error data. One embodiment of a method for creating the individual mask error model is discussed below in conjunction with FIG. 3B. In step 216, the lithography process is simulated for a complete device design using the individual mask error model and a previously-calibrated model of the lithography process (including, e.g., an optical model and a resist model) to produce simulated patterns. In one embodiment, the previously-calibrated model of the lithography process is the focus-exposure model disclosed in U.S. patent application Ser. No. 11/461,994, entitled "System and Method for Creating a Focus-Exposure Model of a Lithography Process," the subject matter of which is hereby incorporated by reference in its entirety. In step 218, a pre-OPC design layout is obtained. The pre-OPC design layout was used to produce the post-OPC layout that was used to manufacture the mask. In step 220, the simulated patterns are compared against the pre-OPC design layout to determine if the manufactured mask will deliver the desired patterning performance before exposing any wafers, i.e., without requiring expensive exposure and wafer metrology tool time, and without the possible consequence that product wafers are later scrapped due to systematic mask errors. If, in step 222, the manufactured mask is determined to be capable of delivering the desired patterning performance, the method continues in step 228; if not, the method continues in step 224, in which the mask is evaluated to determine if it is repairable or reworkable. If the mask is repairable or reworkable, then the method continues in step 226, in which the mask is repaired or reworked based on the simulated patterns produced using the individual mask error model, and then the method returns to step 212, where the repaired or reworked mask is inspected. The simulated patterns produced using the individual mask error model provide important information to mask repair tools. For example, in-field CD variations can be corrected by using fast pulsed laser technology using an in-field CD uniformity map derived from the simulated patterns produced using the individual mask error model. (See, "CD Variations Correction by Local Transmission Control of Photomasks Done with a Novel Laser Based Process," E. Zait, et al., Metrology, Inspection, and Process Control for Microlithography XX, Chas N. Archie, Editor, Proc. SPIE, Vol. 6152, (2006)). If the mask is not repairable or reworkable, then the method returns to step 210, in which a new mask will be manufactured.

It may be possible to provide certain feed-forward information from the simulated patterns to a wafer production process. In FIG. 2A, this feed-forward possibility is shown as optional step 228, where the process condition parameters of the exposure tool are tuned using information from the simulated patterns. In step 230, wafers are printed using the mask.

A portion of the method of FIG. 2A (steps 210-226) may be performed at a mask shop before delivering the mask to a fab, while another portion of the method of FIG. 2A (steps 212-222) may be performed at the fab in order to qualify an incoming mask. Mask verification using simulated patterns generated using an individual mask error model results in significant time and cost savings by virtue of not requiring exposure, development, and metrology of actual wafers. It also provides a quantifiable basis for mask and OPC quality control as well as the ability to proactively predict process corrections that will optimize the common process window of a device design for the particular mask used. For example, simulated patterns generated using the individual mask error model can be used to select, for this specific mask, the optimal exposure tool out of several available exposure tools, by examining which exposure tool's optical model creates the optimal simulated patterns when combined with the mask's individual mask error model. In another example, the exposure tool's settings may be optimized, by examining what settings will produce the optimal simulated patterns when combined with the mask's individual mask error model.

Figure 2B:
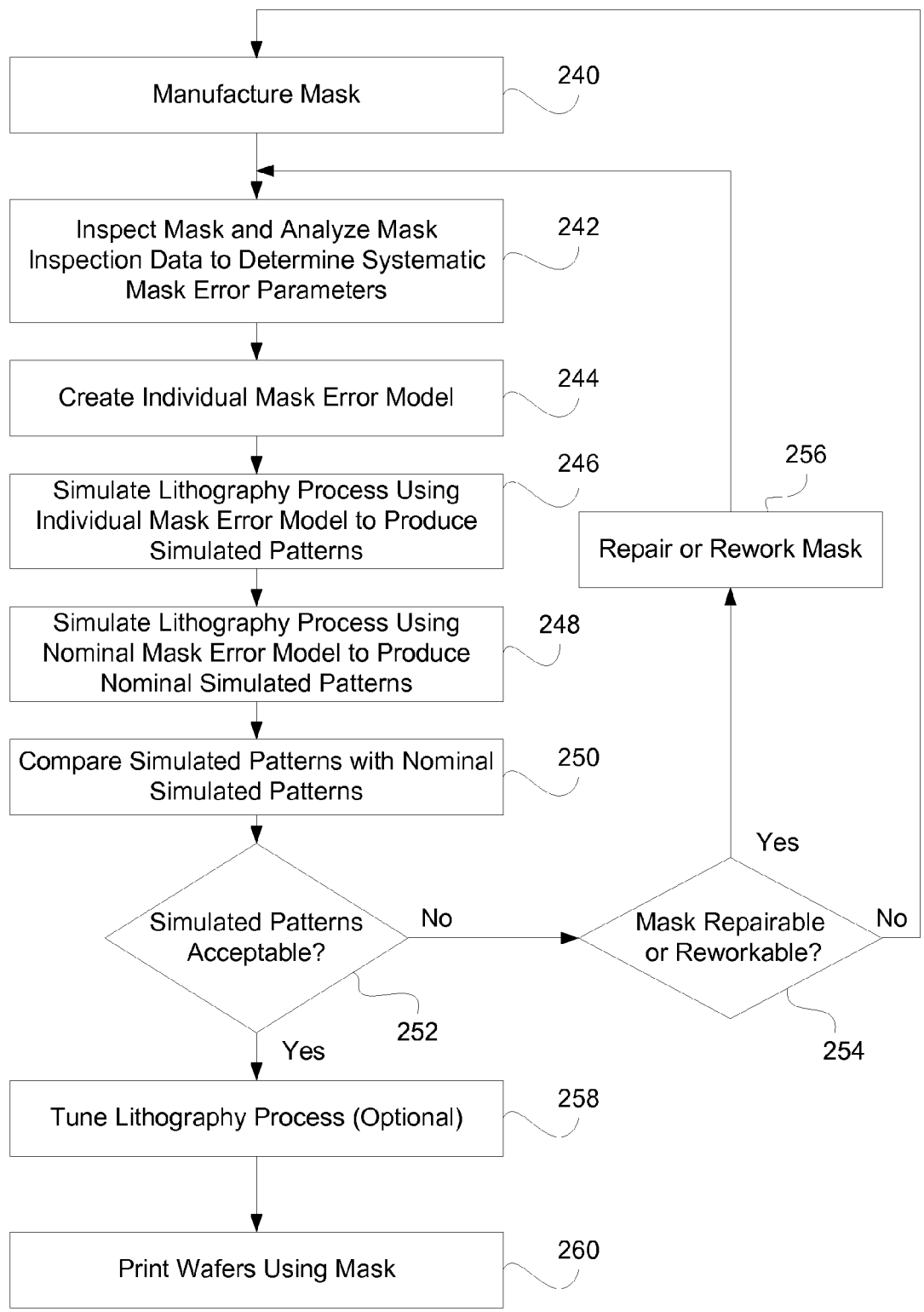
FIG. 2B is a flowchart of method steps for mask verification using an individual mask error model, according to another embodiment of the invention.

FIG. 2B is a flowchart of method steps for mask verification using an individual mask error model, according to another embodiment of the invention. In step 240, a mask is manufactured according to an acceptable post-OPC mask layout. In step 242, the mask is inspected using any of a number of possible metrology tools, as discussed in more detail below, to produce mask inspection data. The mask inspection data is analyzed to extract systematic mask error data for the mask and systematic mask error parameters are then determined from the systematic mask error data. In step 244, an individual mask error model is created for the specific mask that was inspected. The individual mask error model includes systematic mask error parameters based on the extracted systematic mask error data. One embodiment of a method for creating the individual mask error model is discussed below in conjunction with FIG. 3B. In step 246, the lithography process is simulated for a complete device design using the individual mask error model and a previously-calibrated model of the lithography process (including, e.g., an optical model and a resist model) to produce simulated patterns. In one embodiment, the previously-calibrated model of the lithography process is the focus-exposure model disclosed in U.S. patent application Ser. No. 11/461,994, entitled "System and Method for Creating a Focus-Exposure Model of a Lithography Process," the subject matter of which is hereby incorporated by reference in its entirety. In step 248, the lithography process is simulated using a nominal mask error model and the model of the lithography process to produce nominal simulated patterns. The nominal mask error model includes model parameters that represent process-induced average mask errors and is further described below in conjunction with FIGS. 9-10B. The nominal mask error model is not based on mask inspection data of this individual mask, but may be calibrated separately using test masks or may be obtained by averaging the individual mask error models of many previously-inspected masks. Nominal mask error models may have been included as part of the lithography process model used in the OPC correction for this individual mask, as discussed above in conjunction with FIG. 1 and in U.S. patent application Ser. No. 11/461,994. In step 250, the simulated patterns are compared against the nominal simulated patterns to determine if the manufactured mask will deliver the desired patterning performance before exposing any wafers, i.e., without requiring expensive exposure and wafer metrology tool time, and without the possible consequence that product wafers are later scrapped due to systematic mask errors. If, in step 252, the manufactured mask is determined to be capable of delivering the desired patterning performance, the method continues in step 258; if not, the method continues in step 254, in which the mask is evaluated to determine if it is repairable or reworkable. If the mask is repairable or reworkable, then the method continues in step 256, in which the mask is repaired or reworked based on the simulated patterns produced using the individual mask error model, and then the method returns to step 242, where the repaired or reworked mask is inspected. If the mask is not repairable or reworkable, then the method returns to step 240, in which a new mask will be manufactured.

It may be possible to provide certain feed-forward information from the simulated patterns to a wafer production process. In FIG. 2B, this feed-forward possibility is shown as optional step 258, where the process condition parameters of the exposure tool are tuned using information from the simulated patterns. In step 260, wafers are printed using the mask.

Figure 2C:
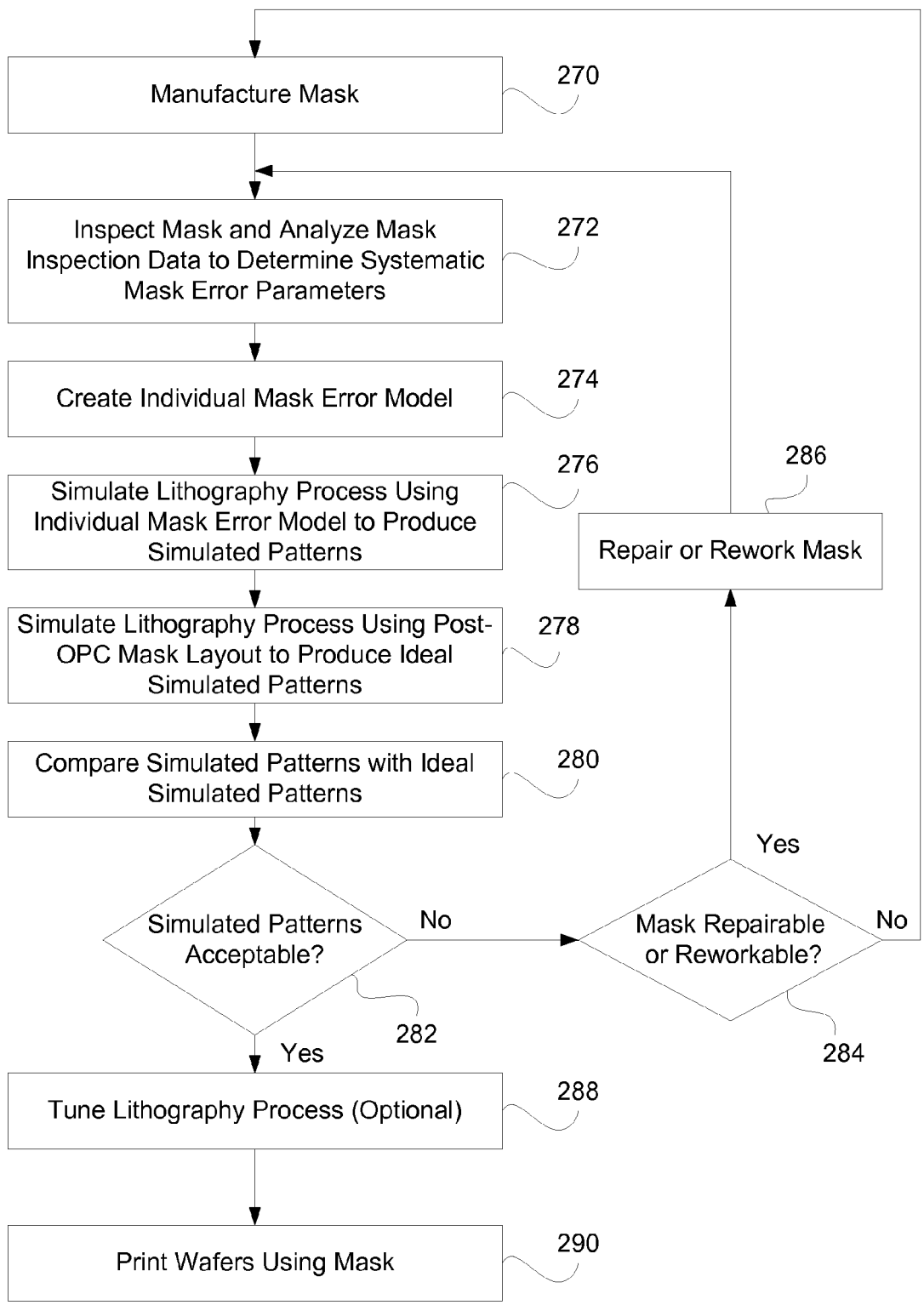
FIG. 2C is a flowchart of method steps for mask verification using an individual mask error model, according to another embodiment of the invention.

FIG. 2C is a flowchart of method steps for mask verification using an individual mask error model, according to another embodiment of the invention. In step 270, a mask is manufactured according to an acceptable post-OPC mask layout. In step 272, the mask is inspected using any of a number of possible metrology tools, as discussed in more detail below, to produce mask inspection data. The mask inspection data is analyzed to extract systematic mask error data for the mask and systematic mask error parameters are then generated from the systematic mask error data. In step 274, an individual mask error model is created for the specific mask that was inspected. The individual mask error model includes systematic mask error parameters created using the extracted systematic mask error data. One embodiment of a method for creating the individual mask error model is discussed below in conjunction with FIG. 3B. In step 276, the lithography process is simulated for a complete device design using the individual mask error model and a previously-calibrated model of the lithography process (including, e.g., an optical model and a resist model) to produce simulated patterns. In one embodiment, the previously-calibrated model of the lithography process is the focus-exposure model disclosed in U.S. patent application Ser. No. 11/461,994, entitled "System and Method for Creating a Focus-Exposure Model of a Lithography Process," the subject matter of which is hereby incorporated by reference in its entirety. In step 278, the lithography process is simulated directly using the post-OPC mask layout and the model of the lithography process to produce ideal simulated patterns. The post-OPC mask layout represents an error-free "perfect" mask. In step 280, the simulated patterns are compared against the ideal simulated patterns to determine if the manufactured mask will deliver the desired patterning performance before exposing any wafers, i.e., without requiring expensive exposure and wafer metrology tool time, and without the possible consequence that product wafers are later scrapped due to systematic mask errors. If, in step 282, the manufactured mask is determined to be capable of delivering the desired patterning performance, the method continues in step 288; if not, the method continues in step 284, in which the mask is evaluated to determine if it is repairable or reworkable. If the mask is repairable or reworkable, then the method continues in step 286, in which the mask is repaired or reworked based on the simulated patterns produced using the individual mask error model, and then the method returns to step 272, where the repaired or reworked mask is inspected. If the mask is not repairable or reworkable, then the method returns to step 270, in which a new mask will be manufactured.

It may be possible to provide certain feed-forward information from the simulated patterns to a wafer production process. In FIG. 2C, this feed-forward possibility is shown as optional step 288, where the process condition parameters of the exposure tool are tuned using information from the simulated patterns. In step 290, wafers are printed using the mask.

A variety of different metrology tools may be used to inspect a mask to produce mask inspection data that will be analyzed to extract systematic mask error data used to generate the systematic mask error parameters for the individual mask error model. These metrology tools include, but are not limited to, conventional optical mask inspection tools, critical dimension scanning electron microscopes (CD-SEMs) or imaging SEMs, atomic force microscopes (AFMs) or scatterometry systems, or aerial image measurement system (AIMS) tools. In one embodiment, a sensor wafer that includes an image sensor array is used to measure the aerial image projected from the mask in-situ, i.e., at the wafer plane of an exposure tool under actual illumination and projection conditions at the correct exposure wavelength to verify and possibly optimize the performance not only of the mask but also of the mask-exposure tool combination to be used in wafer production. One embodiment of an image sensor array for measuring an aerial image produced by an exposure tool is disclosed in U.S. Pat. No. 6,803,554, entitled "System and Method for Lithography Process Monitoring and Control," the subject matter of which is hereby incorporated by reference in its entirety.

Any mask metrology technique for extracting systematic mask error data of a mask for generating systematic mask error parameters will not generally require a full exposure field inspection of the mask but may be based on a limited number of samples. This qualitative difference from traditional mask inspection, which requires a full exposure field inspection to identify point defects, is the reason for the considerable flexibility to use any of a variety of inspection tools to extract the systematic mask error data and generate systematic mask error parameters from the systematic mask error data. In one embodiment of the invention, suitable sampling locations within an exposure field are identified automatically by a software tool that may be integrated with the lithography simulation system based on the post-OPC layout information of the mask being inspected.

Also, while preferably the systematic mask error parameters are generated explicitly for an individual mask error model to be used in a lithography process simulation, mask quality may also be tested and verified by using the lithography simulation system to "forward" calculate the expected results of mask measurements on each metrology tool (for example, the image measured by an image sensor array in a scanner), by quantifying a metric of agreement between simulation and actual measurement, and/or by specifying suitable boundaries on this metric as pass/fail criteria.

In addition, while simulating a lithography process using the individual mask error model is suitable for characterizing individual manufactured masks, simulating a lithography process using a nominal mask process model may also be used to characterize a specific mask manufacturing process or a particular mask manufacturing tool rather than individual masks. In a preferred embodiment, specific test masks having well-defined pattern variations that completely cover the relevant parameter space of systematic mask error parameters are inspected to produce a nominal mask process model for a mask manufacturing process, instead of production masks. The nominal mask process model for a mask manufacturing process is further described below in conjunction with FIGS. 9-10B.

In another embodiment, systematic mask error parameters for a nominal mask process model for a mask manufacturing process are determined from an empirical or first-principle model of the mask manufacturing process. The mask manufacturing process generally uses similar technologies as the wafer printing process, i.e., exposure of resist by a writing tool, resist development, and subsequent etch of the mask substrate. A simulation system similar to the one used for lithography process simulation may be used to extract the systematic mask error data and then generate the systematic mask error parameters, after suitable calibration of the mask manufacturing process parameters.

Below, further details are provided on certain aspects and specific embodiments of the invention. Any of the descriptions of these specific embodiments are intended as examples to illustrate the general principle without restricting the invention to these particular embodiments.

It is important to note that the model of a lithography process includes separate modules that represent mask properties (a mask model such as the individual mask error model); optical properties of the illumination and projection system such as numerical aperture, partial coherence, illumination profile, and aberrations (an optical model); and resist properties (a resist model). The importance of model separability has been discussed elsewhere in detail; in brief, simplified "lumped models" exist and may be able to predict performance of the lithography process to some extent. However, a separable model of a lithography process reflects physical reality more closely and results in more accurate and more robust predictions, in particular under variations of process parameters, e.g., across a process window. A system and a method achieving such accurate predictions are disclosed in U.S. patent application Ser. No. 11/461,994, entitled "System and Method for Creating a Focus-Exposure Model of a Lithography Process." Particularly, in U.S. patent application Ser. No. 11/461,994, a system and a method for creating a focus-exposure model for a lithography process are disclosed. The system and the method utilize calibration data along multiple dimensions of parameter variations, in particular within an exposure-defocus process window space. The system and the method provide a unified set of model parameter values that result in better accuracy and robustness of simulations at nominal process conditions, as well as the ability to predict lithographic performance at any point continuously throughout a complete process window area without a need for recalibration at different settings. Simulations using the individual mask error model in conjunction with the focus-exposure model provide highly realistic simulated patterns that can be used to accurately predict the performance of the wafer printing process.

Figure 3A:
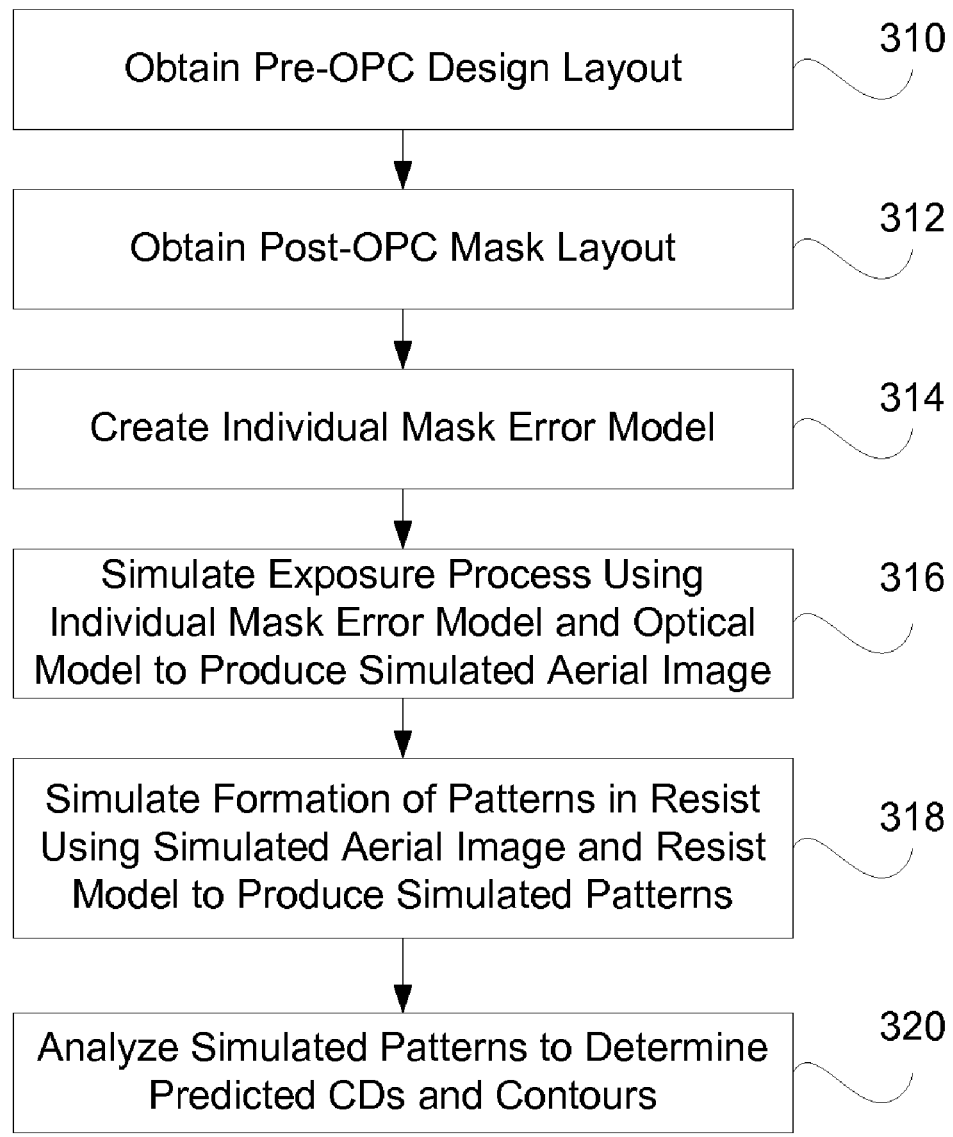
FIG. 3A is a flowchart of method steps for simulating a lithography process using an individual mask error model, according to one embodiment of the invention.

FIG. 3A is a flowchart of method steps for simulating a lithography process using an individual mask error model, according to one embodiment of the invention. In step 310, a pre-OPC design layout showing the design intent for a device is obtained. Then, in step 312, a post-OPC mask layout is obtained. The post-OPC mask layout is created by applying OPC and other RETs to the pre-OPC design layout. In step 314, an individual mask error model of a mask manufactured using the post-OPC mask layout is created. One embodiment of a method for creating the individual mask error model is discussed below in conjunction with FIG. 3B. Then, in step 316, the exposure process is simulated using the individual mask error model and an optical model (such as the optical model of the focus-exposure model disclosed in U.S. patent application Ser. No. 11/461,994) of an exposure tool to produce a simulated aerial image, i.e., simulated patterns projected onto a resist-coated wafer. In step 318, the formation of patterns in a resist layer is simulated using the simulated aerial image and a resist model to produce simulated patterns. Then, in step 320, the simulated patterns are analyzed to determine predicted critical dimensions and contours of the printed patterns in resist.

Model separability also implies that the separate modules of the lithography process model can be independently calibrated, tuned, or adjusted in order to reflect the properties or changes of the physical entities described by the model components. For example, if a known mask is used on different exposure tools or with different optical settings such as NA or sigma, different optical models may be used in conjunction with the same individual mask error model. Lithography simulations using the same individual mask error model with different optical models of different exposure tools can be used to identify the exposure tool that will provide the best performance using the mask represented by the individual mask error model. Clearly, the individual mask error model is required to describe correctly the physical type of the mask, i.e., attenuation and phase shifting levels. The individual mask error model also explicitly takes into account systematic variations or imperfections related to the mask manufacturing process. These variations or imperfections may include overall bias of actual mask linewidths vs. designed linewidths, spatial variation of such biases across the mask area, variation of such biases with pitch, pattern density, or orientation. Besides bias, the systematic mask errors described by the individual mask error model can also include corner rounding radii or line edge roughness. The individual mask error model may also use a more detailed three-dimensional modeling of the interaction between light and the mask structure.

Figure 3B:
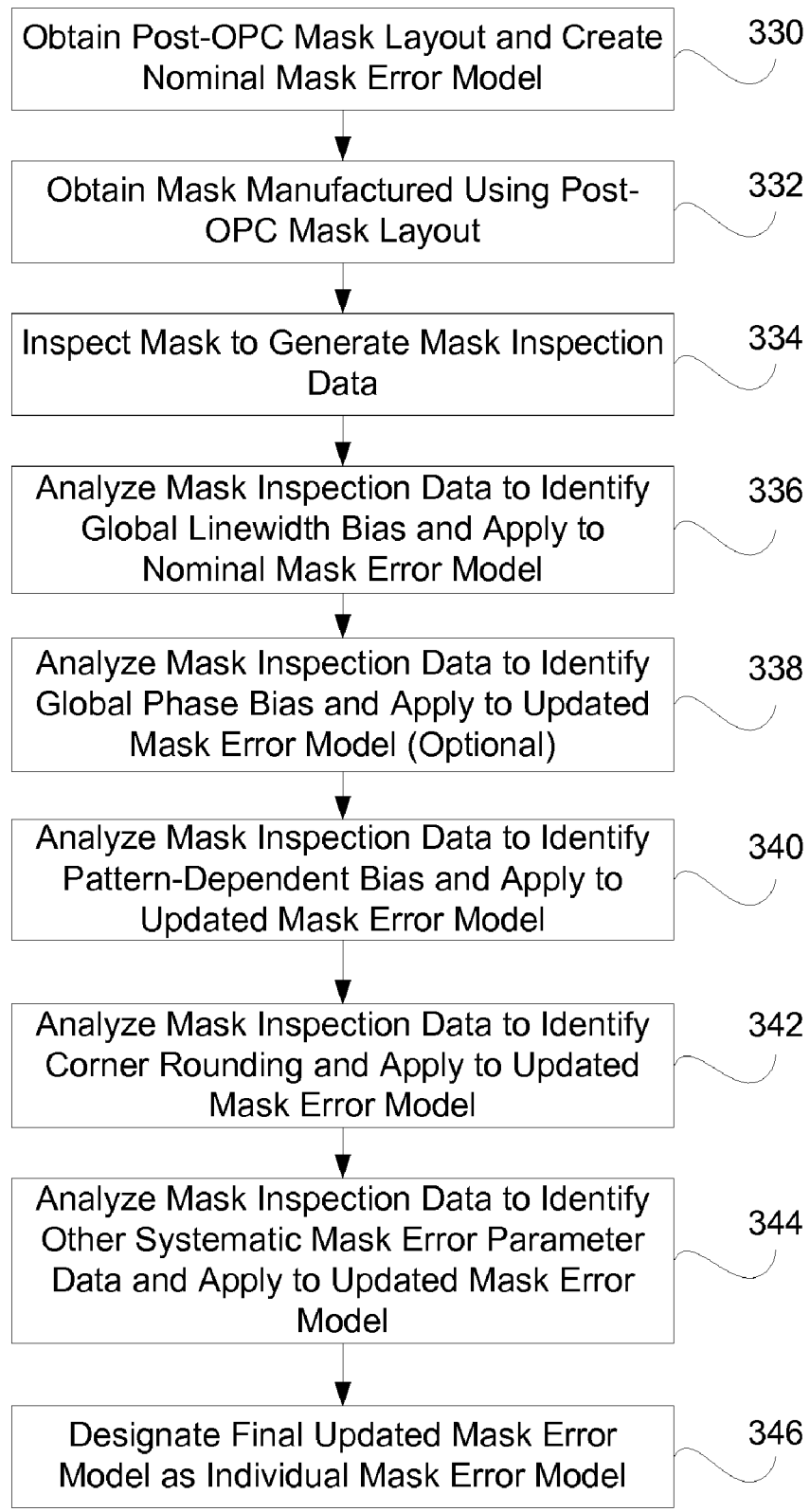
FIG. 3B is a flowchart of method steps for creating an individual mask error model, according to one embodiment of the invention.

FIG. 3B is a flowchart of method steps for creating an individual mask error model, according to one embodiment of the invention. In step 330, a post-OPC mask layout is obtained, typically in a CAD file in GDSII format, and a nominal mask error model for the post-OPC mask layout is created. In step 332, a mask manufactured using the post-OPC mask layout is obtained. In step 334, the mask is inspected with a suitable inspection tool to produce mask inspection data. In step 336, the mask inspection data is analyzed to identify a global linewidth bias and the global linewidth bias is applied to the nominal mask error model, producing an updated mask error model. A global linewidth bias occurs when the width of lines created on the mask differ systematically from the design values for all linewidths. In optional step 338, the mask inspection data is analyzed to identify global phase bias and the global phase bias is applied to the updated mask error model. For phase-shifting masks, a global offset between designed and manufactured phase steps may occur. Optional step 338 will only apply when the manufactured mask is a phase-shifting mask. In step 340, the mask inspection data is analyzed to identify pattern-dependent linewidth or bias variations, and these variations are applied to the updated mask error model. These variations may include pattern-orientation dependent variations, pattern-density dependent variations (such as pitch dependence for dense line patterns), or systematic variations of critical dimensions across the area of the mask. In step 342, the mask inspection data is analyzed to identify corner rounding effects and the corner-rounding effects are applied to the updated mask error model. The corner rounding effects may be modeled by morphological operations well-known in image processing, or low-pass filtering or convolution with, e.g., a two-dimensional Gaussian function. In step 344, the mask inspection data is analyzed to identify other systematic mask error parameters to accurately describe the characteristics of the mask and these systematic mask error parameters are applied to the updated mask error model. In step 346, the mask error model that was updated using all of the systematic mask error parameters is designated as the individual mask error model. The individual mask error model reflects operations that modify the original post-OPC design layout and the set of specific parameters of these operations.

Figure 4:
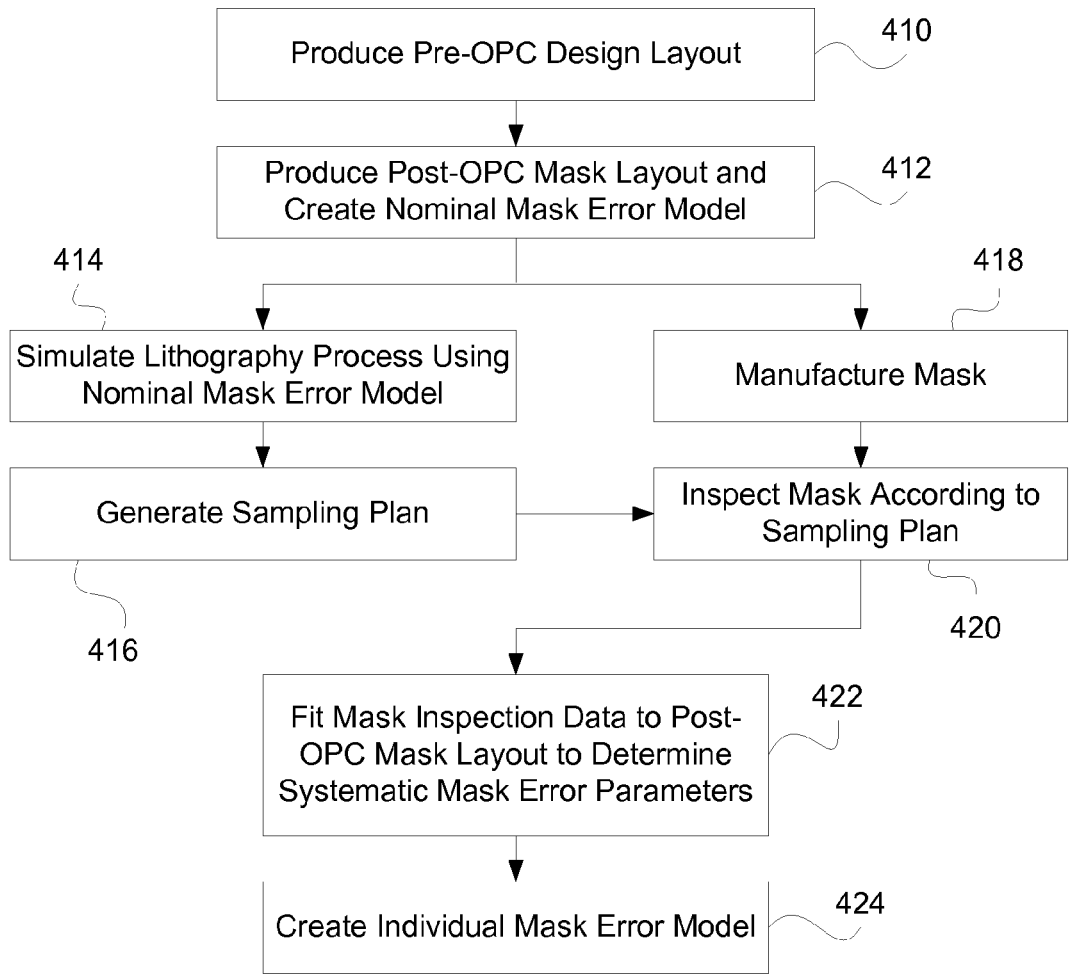
FIG. 4 is a flowchart of method steps for creating an individual mask error model using mask inspection data at multiple sampling locations, according to another embodiment of the invention.

Extracting systematic mask error parameters for creating an individual mask error model will not generally require a full-field mask inspection. Such extraction may be based on mask inspection data from a suitably chosen sampling of representative locations in the mask. FIG. 4 is a flowchart of method steps for creating an individual mask error model using mask inspection data from multiple sampling locations, according to another embodiment of the invention. In step 410, a pre-OPC design layout showing the design intent for a device is produced. In step 412, the pre-OPC design layout is processed using OPC and other RETs to produce a post-OPC mask layout and a nominal mask error model for the post-OPC mask layout is created. In step 414, a lithography process is simulated using a model of the lithography process (including, e.g., an optical model and a resist model) and the nominal mask error model to produce initial simulated patterns. In step 416, a sampling plan for inspecting a mask manufactured using the post-OPC mask layout is generated. The sampling plan includes sampling locations where the mask will be inspected by a metrology tool and an inspection recipe. In one embodiment, the sampling locations are identified from the initial simulated patterns by software that is integrated with the lithography simulation system. The post-OPC mask layout is made available to the lithography simulation system, which therefore can identify sampling locations and measurement options for a particular mask. Sampling locations should be selected to cover as wide a range as possible of the parameter space that affects the systematic mask errors, e.g., pattern density, pattern orientation, pattern pitch, pattern size, pattern polarity, corners of different orientation and polarity, line-end with varying spacing, and at various locations on the mask area (e.g., a 3×3 location matrix), etc. Creating a sampling plan is further discussed below in conjunction with FIG. 6.

In step 418, a mask is manufactured according to the post-OPC mask layout. In step 420, the manufactured mask is inspected in a metrology tool according to the sampling plan to produce mask inspection data. In step 422, a data fitting routine determines optimal values of systematic mask error parameters for an individual mask error model by fitting the systematic mask error data to input variables of the mask error model such as the pattern environment and pattern location on a mask, where the systematic mask error data is based on the differences between the extracted physical mask data from the mask inspection data and the post-OPC mask layout data. The data fitting routine uses the systematic mask error parameters as fitting parameters that are optimized in order to provide the best agreement between the mask inspection data and the post-OPC mask layout. The data fitting routine may be an integrated part of the same lithography simulation system used for design verification, or it may be part of a standalone lithography simulation and data analysis system that may have a data interface to the above-mentioned lithography simulation system to communicate sampling information and the systematic mask error parameters. Finally, in step 424, an individual mask error model is created using the optimal values of the systematic mask error parameters.

In one embodiment, a standalone lithography simulation and data analysis system for creating an individual mask error model includes a computing platform and software programs for extracting systematic mask error data from mask inspection data and generating systematic mask error parameters from the extracted systematic mask error data. The system also includes a data interface, e.g., via a local or wide area network, to a design simulation system so that sampling information or design information may be provided downstream and updated systematic mask error parameters may be provided upstream back to the design simulation system. In another embodiment, the lithography simulation and data analysis system is integrated within a mask metrology tool rather than being implemented on a separate computing platform.

Figure 5A:
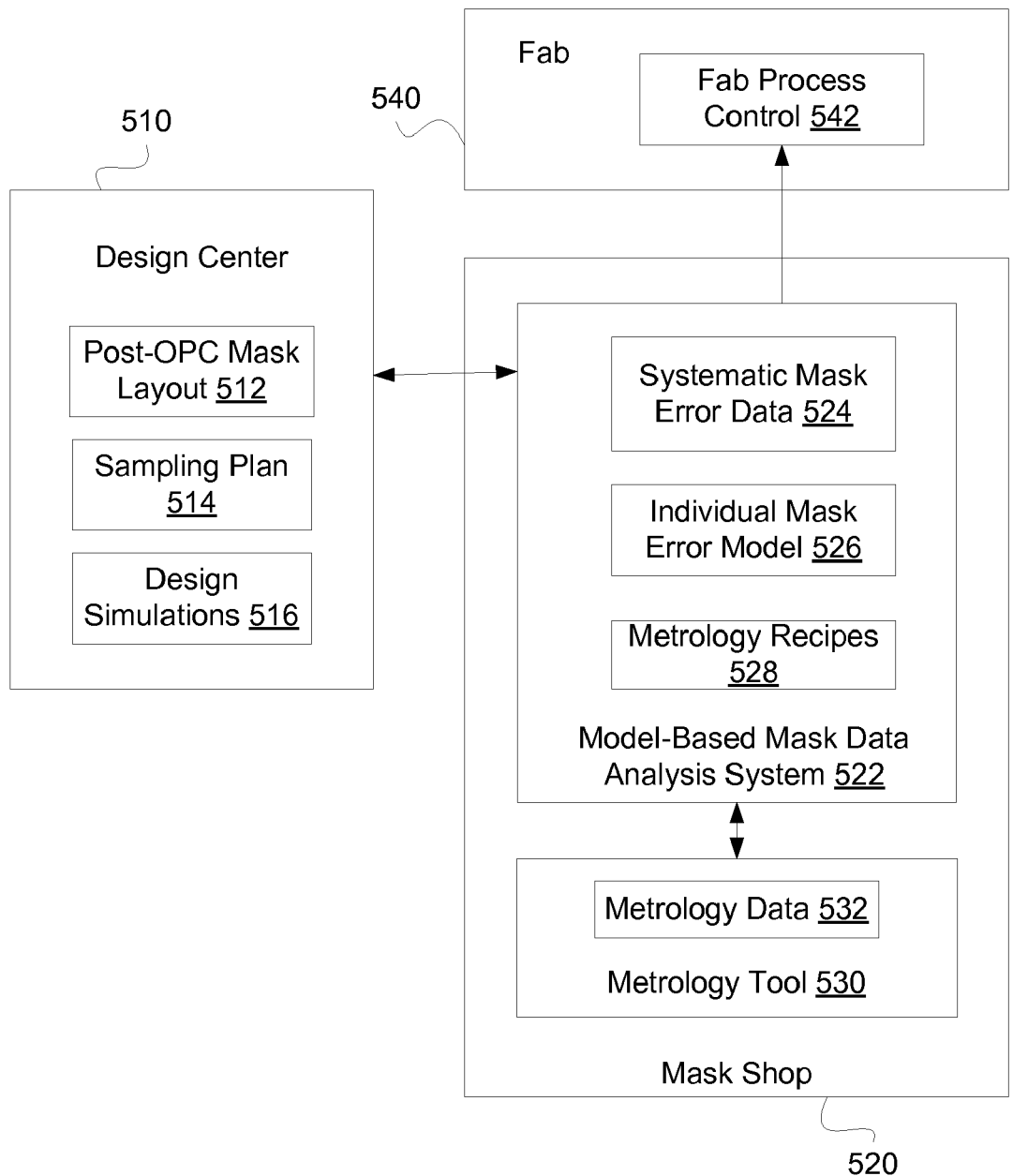
FIG. 5A is a diagram of a model-based mask data analysis system for creating an individual mask error model at a mask shop, according to one embodiment of the invention.

FIG. 5A is a diagram of a model-based mask data analysis system for creating an individual mask error model at a mask shop, according to one embodiment of the invention. A model-based mask data analysis system 522 is located at a mask shop 520 to identify systematic mask error data of masks. A design center 510 provides a post-OPC mask layout 512 and a sampling plan 514 for a mask inspection tool to model-based mask data analysis system 522. Model-based mask data analysis system 522 provides metrology recipes 528 based upon the sampling plan 514 to a metrology tool 530. Metrology tool 530 may be any one of metrology tools typically found in a mask shop, such as a CD-SEM. Metrology tool 530 inspects a mask (not shown) according to metrology recipes 528 and provides the resulting metrology data 532 (e.g., images and critical dimensions) to model-based mask data analysis system 522. Model-based mask data analysis system 522 analyzes metrology data 532 to extract systematic mask error data and generate systematic mask error parameters 524 from the extracted systematic mask error data and create an individual mask error model 526. Model-based mask data analysis system 522 may also update an existing individual mask error model and determine post-OPC design layout verification data. Model-based mask data analysis system 522 sends individual mask error model 526 to design center 510, which uses individual mask error model 526 to produce design simulations 516 for OPC and RET design verification, and process window and hot spot analysis. Model-based mask data analysis system 522 also sends systematic mask error parameters 524 to a fab process control 542 located in a fab 540.

Figure 5B:
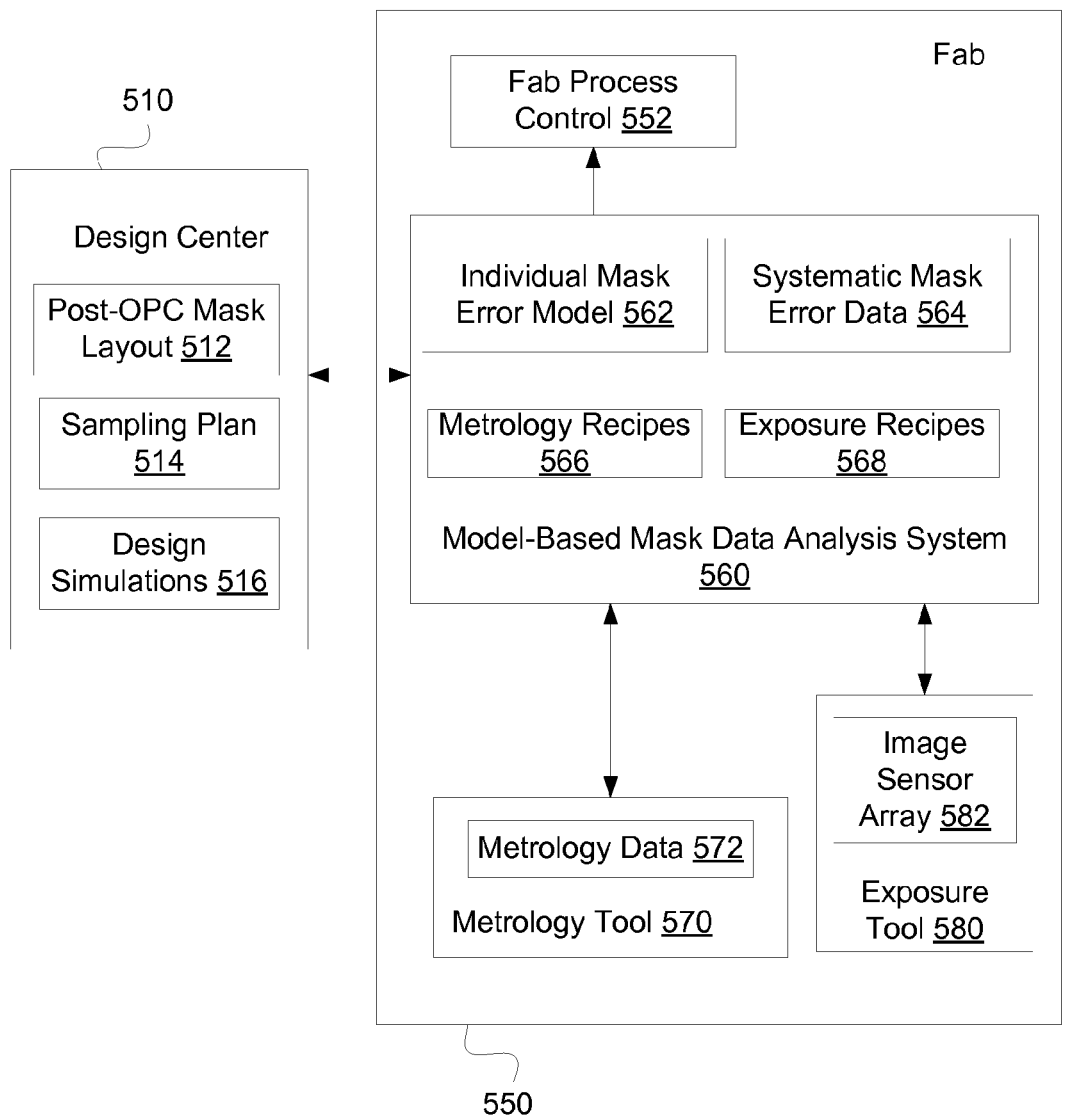
FIG. 5B is a diagram of a model-based mask data analysis system for creating an individual mask error model at a fab, according to one embodiment of the invention.

In a fab, other tools besides metrology tools may be used for mask inspection. FIG. 5B is a diagram of a model-based mask data analysis system 560 for creating an individual mask error model at a fab 550, according to one embodiment of the invention. Model-based mask data analysis system 560 analyzes mask inspection data to extract systematic mask error data and generate systematic mask error parameters 564 from the extracted systematic mask error data and create an individual mask error model 562. Design center 510 provides post-OPC mask layout 512 and sampling plan 514 to model-based mask data analysis system 560. Model-based mask data analysis system 560 provides metrology recipes 566 based upon sampling plan 514 to a metrology tool 570, such as a CD-SEM, which measures a mask (not shown) according to metrology recipes 566 and provides the resulting metrology data (e.g., images and critical dimensions) 572 to model-based mask data analysis system 560. Model-based mask data analysis system 560 may also send exposure recipes 568 based upon sampling plan 514 to an exposure tool 580, such as a scanner. In exposure tool 580, an image sensor array 582 (for example, the image sensor array of U.S. Pat. No. 6,803, 554) measures an aerial image produced using a mask according to exposure recipes 568 and sends aerial image data (not shown) to model-based mask data analysis system 560. Model-based mask data analysis system 560 analyzes metrology data 572 and/or the aerial image data to extract systematic mask error data and generate systematic mask error parameters 564 from the extracted systematic mask error data and create an individual mask error model 562. Model-based mask data analysis system 560 may also provide updated individual mask error models and post-OPC design layout verification data to design center 510, which uses this information to produce design simulations 516 for OPC and RET design verification, and process window and hot spot analysis. Model-based mask data analysis system 560 also sends systematic mask error parameters 564 to fab process control 552.

Figure 6:
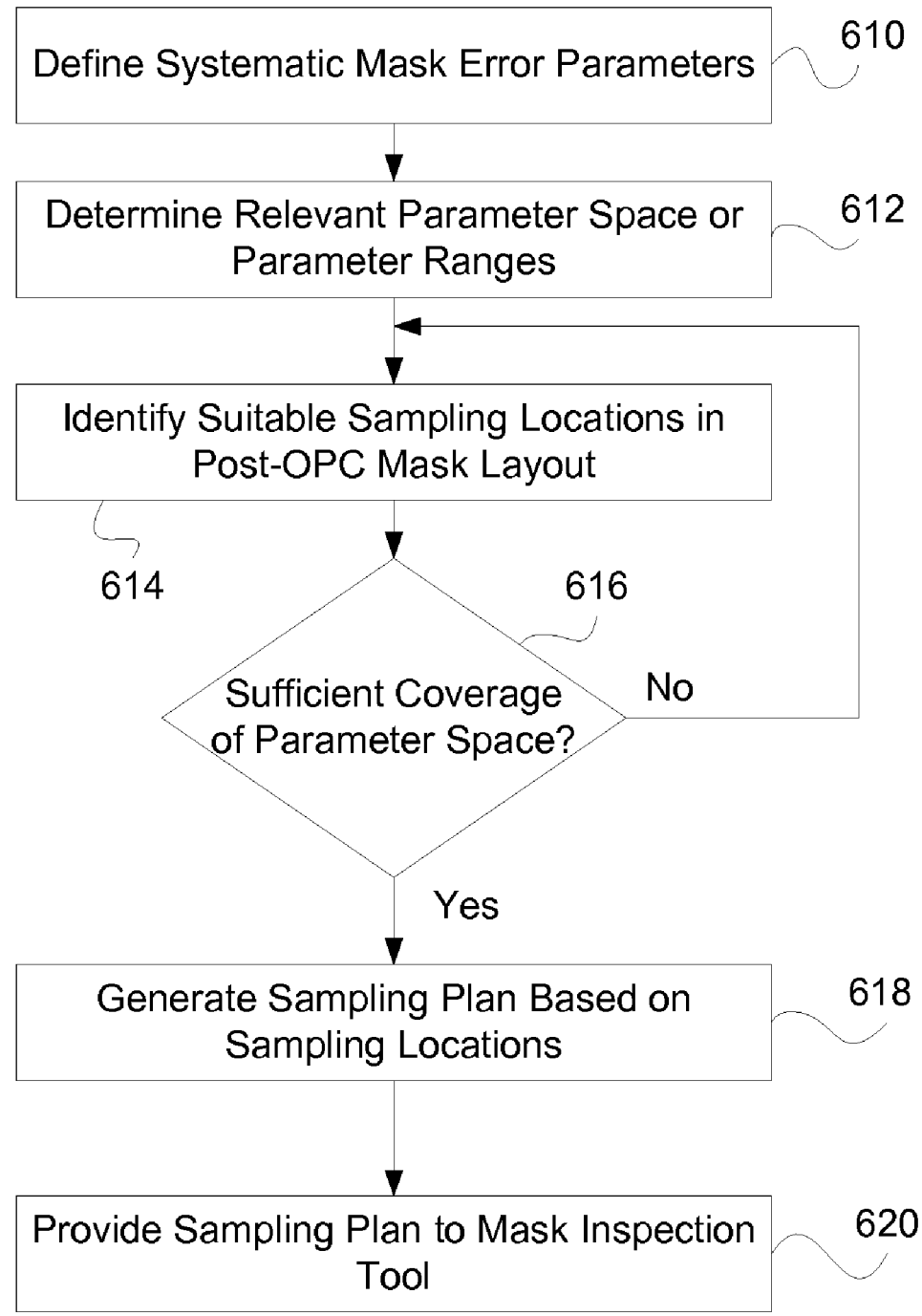
FIG. 6 is a flowchart of method steps for generating a sampling plan for inspecting a mask, according to one embodiment of the invention.

A major objective of generating a sampling plan for accurate generation of systematic mask error parameters from mask inspection data is to provide sufficient coverage of a systematic mask error parameter space by the selected sampling locations. FIG. 6 is a flowchart of method steps for generating a sampling plan for inspecting a mask, according to one embodiment of the invention. In step 610, a number of systematic mask error parameters that may be varied during data fitting between mask inspection data and simulated patterns using an individual mask error model are defined within the context of lithography process model including an optical model, a resist model, and the individual mask error model. The systematic mask error parameters include a selection of the most significantly variable mask error parameters or mask error parameters having the largest impact on patterning performance (which may be based on a sensitivity analysis), or may include a wide range of systematic mask error parameters. Then, in step 612, a range of relevant values is determined for each of the systematic mask error parameters, generally defining an area within a multi-dimensional mask error parameter space. As a simple example, the mask error parameter space may include pattern lines with varying nominal line widths and cover a range of pitches or local pattern density. In step 614, suitable sampling locations are identified within the post-OPC mask layout by a search algorithm that identifies characteristic pattern features having representative values within the previously defined parameter space. Sampling locations can also be selected from the post-OPC mask layout directly to cover as wide a range as possible of the parameter space that affects the systematic mask errors, e.g., pattern density, pattern orientation, pattern pitch, pattern size, pattern polarity, corners of different orientation and polarity, line-end with varying spacing, and at various locations on the mask area (e.g., a 3×3 location matrix), etc. In step 616, the density and range of coverage of the parameter space by the identified sampling locations is evaluated to determine if the coverage of the parameter space is sufficient. If so, the method continues in step 618; if not, the method returns to step 614 where the search algorithm is repeated until the coverage of the parameter space is sufficient. In step 618, a sampling plan based on the selected sampling locations is generated. Then, in step 620, the sampling plan is provided to a mask inspection or metrology tool.

Figure 7A:
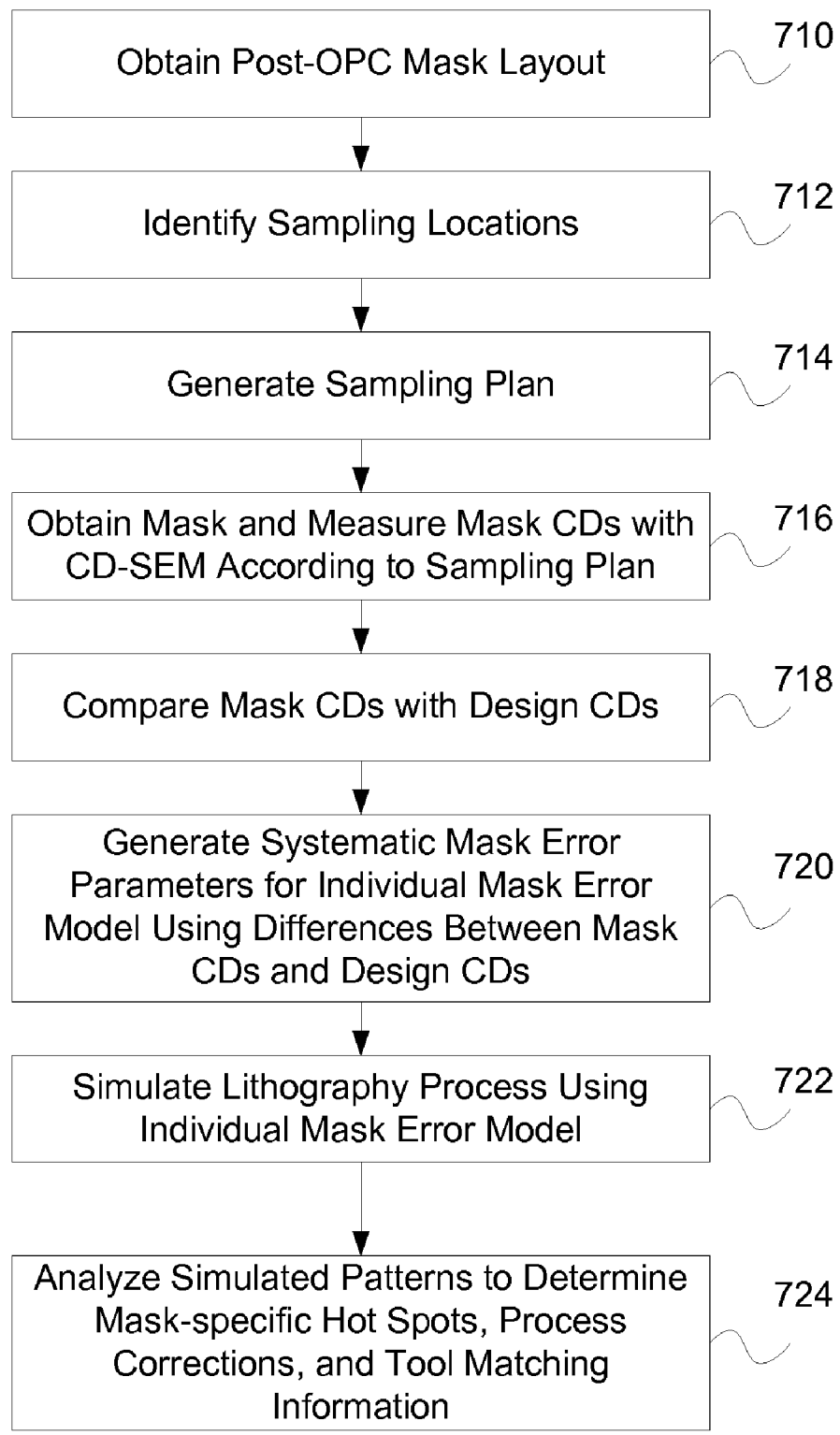
FIG. 7A is a flowchart of method steps for creating an individual mask error model and verifying a mask using mask critical dimension (CD) measurements, according to one embodiment of the invention.

FIG. 7A is a flowchart of method steps for creating an individual mask error model and verifying a mask using mask critical dimension (CD) measurements, according to one embodiment of the invention. In the FIG. 7A embodiment, for ease of illustration the individual mask error model is only characterized by a systematic variation of mask critical dimension linewidths across the area of the mask. Other or additional systematic mask error parameters, such as corner rounding or line edge roughness may be used. In step 710, a post-OPC mask layout of a device is obtained. In step 712, sampling locations in the post-OPC mask layout are identified. In step 714, a sampling plan is generated for inspecting a mask manufactured using the post-OPC mask layout. In one embodiment, the sampling plan is generated using the method of FIG. 6. Then, in step 716, a mask manufactured according to the post-OPC mask layout is obtained and a CD-SEM tool is used to directly measure the linewidths on the mask according to the sampling plan. In another embodiment, an imaging SEM is also used to determine two-dimensional image-based mask error parameters, such as corner rounding. In step 718, the measured linewidths (mask CDs) are compared (assuming that the CD-SEM tool has been calibrated) against the designed linewidth values (design CDs) in the post-OPC mask layout. For example, fitting the mask linewidth bias (i.e., deviation of actual vs. designed critical dimensions) vs. the linewidth size will characterize the pattern-size-dependent bias nonlinearity of the specific mask under consideration. In step 720, systematic mask error parameters are generated for an individual mask error model using the mask CD error data, where the mask CD error data is based on the differences between the mask CD values and the designed CD values. The systematic mask error parameters may be generated using a parametric fit or a look-up table. In step 722, the lithography process is simulated using a model of the lithography process (including, e.g., an optical model and a resist model) and the individual mask error model to produce simulated patterns. Then, in step 724, the simulated patterns are analyzed to determine mask-specific hot spots and other design defects, process corrections, and tool matching information. The process corrections may include focus offset and changes to NA and sigma settings of the exposure tool. The simulated patterns may also be used to verify mask and OPC quality using any of the methods described above in conjunction with FIGS. 2A-2C, and to determine process windows for the lithography process.

Figure 7B:
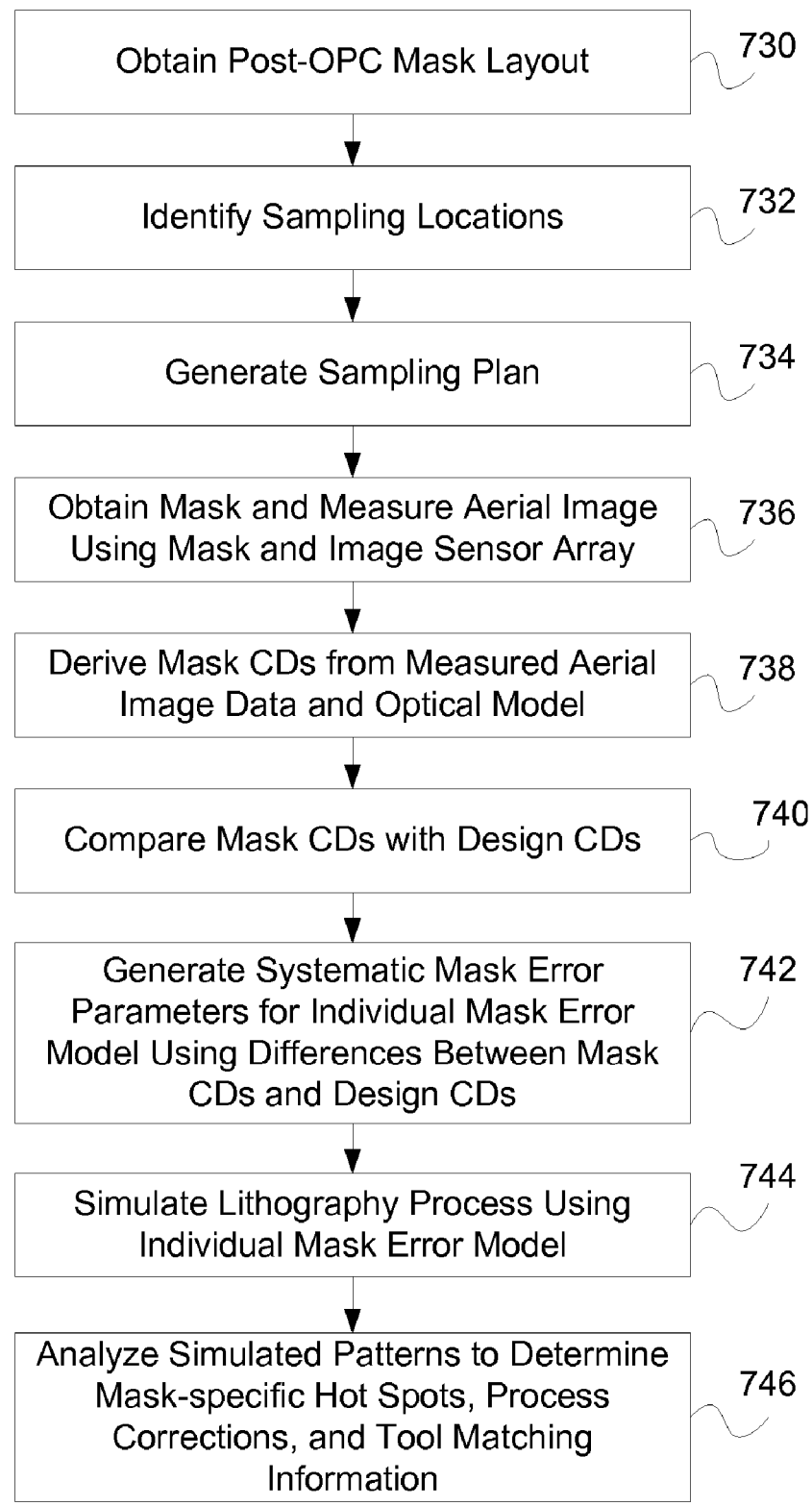
FIG. 7B is a flowchart of method steps for creating an individual mask error model and verifying a mask using aerial image measurements, according to one embodiment of the invention.

FIG. 7B is a flowchart of method steps for creating an individual mask error model and verifying a mask using aerial image measurements, according to another embodiment of the invention. The method of FIG. 7B is similar to the method of FIG. 7A, except that in step 736 an aerial image sensor, such as a sensor wafer including an image sensor array, is used to measure a projected image from the mask in an actual production exposure tool. In one embodiment, measuring an aerial image using an image sensor array is implemented according to the disclosure of U.S. Pat. No. 6,803,554. Measuring the aerial image using the image sensor array of the '554 patent provides massive amounts of data in the form of high-resolution image patches on millions of sampling locations across the exposure field of the exposure tool. While the measured aerial image (or, more precisely, the sensor image) may not directly indicate the width of lines and other metrics on the mask, suitable analysis and calibration of the measured aerial image data can be defined through simulating the aerial image formation process in the exposure tool. For example, it is known that small changes in mask linewidths will lead primarily to changes in overall signal intensity, which may be measured for example by an integrated signal level over the cross section of a line in the measured aerial image. Similarly, the total area of contacts or other small features on the mask may be directly measured on the images, even for features that are too small to print, such as assist bars or other sub-resolution assist features. From such measurements, feature sizes and variation of feature sizes with pattern density and across the field may be explicitly derived as systematic mask error parameters. Alternatively, certain parts of the individual mask error model may be expressed in terms of more directly-measurable parameters such as contact energy or relative signal levels. Extraction of certain systematic mask error parameters may furthermore be facilitated by acquiring data under a variety of conditions (e.g., through focus) using multiple NA-sigma settings or different source polarizations. For example, parameters of phase-shifting masks may have characteristic through-focus behavior so that aerial image data measured at multiple focus settings will allow a better characterization of the actual mask properties. Finally, as in FIG. 7A, an individual mask error model reflecting the physical structure of the actual production mask is used for simulation of patterning performance, mask verification, and process corrections.

In the FIG. 7B embodiment, for ease of illustration the individual mask error model is only characterized by a systematic variation of mask critical dimension linewidths across the area of the mask. Other or additional mask error parameters, such as corner rounding or line edge roughness may be used. In step 730, the post-OPC mask layout of a product is obtained. In step 732, sampling locations in the post-OPC mask layout are identified. In step 734, a sampling plan is generated for inspecting a mask manufactured using the post-OPC mask layout. In one embodiment, the sampling plan is generated using the method of FIG. 6. In step 736, a mask manufactured according to the post-OPC mask layout is obtained and an aerial image produced by the mask used in an exposure tool is measured using an image sensor array according to the sampling plan. In step 738, the mask CD values are extracted from the aerial image measurement data and an optical model of the exposure tool and the image sensor array. In step 740, the mask CD values are compared against the design CD values in the post-OPC mask layout to generate mask CD error data based on the differences between the mask CD values and the design CD values. In step 742, systematic mask error parameters are generated for an individual mask error model from the mask CD error data. The systematic mask error parameters may be generated using a parametric fit or a look-up table. Then, in step 744, the lithography process is simulated using a model of the lithography process (including, e.g., an optical model and a resist model) and the individual mask error model to produce simulated patterns. In step 746, the simulated patterns are analyzed to determine mask-specific hot spots and other design defects, process corrections, and tool matching information. The process corrections may include focus offset and changes to NA and sigma settings of the exposure tool. The simulated patterns may also be used to verify mask and OPC quality using any of the methods described above in conjunction with FIGS. 2A-2C, and to determine process windows of the lithography process.

Figure 7C:
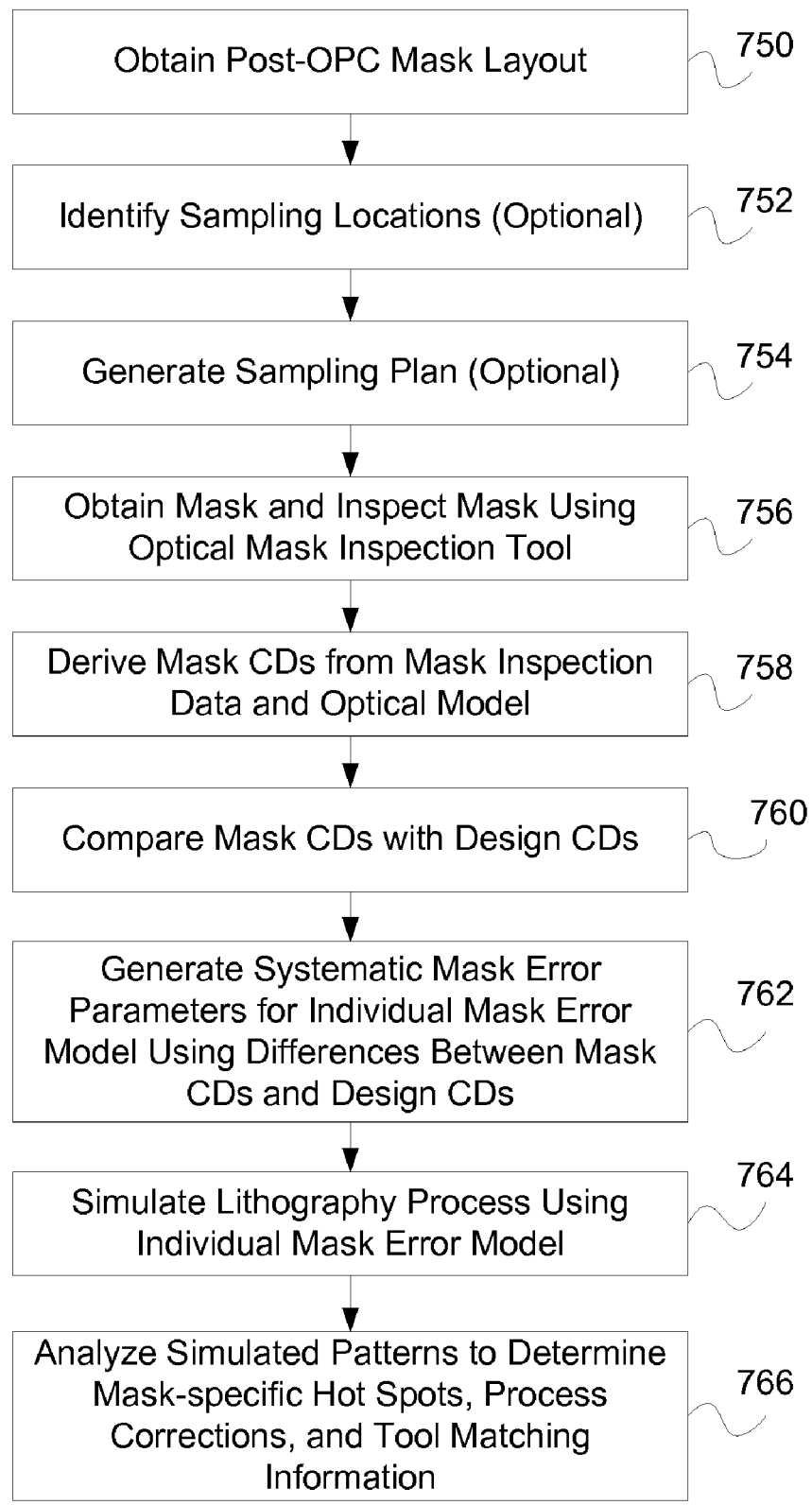
FIG. 7C is a flowchart of method steps for creating an individual mask error model and verifying a mask using an optical mask inspection tool, according to one embodiment of the invention.

FIG. 7C is a flowchart of method steps for creating an individual mask error model and verifying a mask using an optical mask inspection tool, according to another embodiment of the invention. The method of FIG. 7C is similar to the method of FIG. 7A, except that in step 756 an optical mask inspection tool, as is commonly used for mask contamination inspection or point-defect detection, is used to inspect a mask. Optical mask inspection tools are typically designed for full coverage of the complete mask area, so the steps of identifying sampling locations and generating sampling plans from the post-OPC mask layout are optional. Global or slowly-varying systematic mask error parameters may be determined from an optical mask inspection tool, as described for example in "Apparatus and Methods for Collecting Global Data during a Mask Inspection," U.S. Pat. No. 6,516,085, the subject matter of which is hereby incorporated by reference in its entirety.

In the FIG. 7C embodiment, for ease of illustration the individual mask error model is only characterized by a systematic variation of mask critical dimension linewidths across the area of the mask. Other or additional mask error parameters, such as corner rounding or line edge roughness may be used. In step 750, the post-OPC mask layout of a product is obtained. Then, in optional step 752, sampling locations in the post-OPC mask layout are identified. In optional step 754, a sampling plan is generated for inspecting a mask manufactured using the post-OPC mask layout. In step 756, a mask manufactured according to the post-OPC mask layout is obtained and the mask is inspected using an optical mask inspection tool. If applicable, such inspection is in accordance with the sampling plan optionally generated in step 754. In step 758, the mask CD values are extracted from the mask inspection data and an optical model of the optical mask inspection system. In step 760, the mask CD values are compared against the design CD values in the post-OPC mask layout to generate mask CD error data based on the differences between the mask CD values and the design CD values. In step 762, systematic mask error parameters are generated for an individual mask error model from the mask CD error data. The systematic mask error parameters may be generated using a parametric fit or a look-up table. Then, in step 764, the simulated patterns are analyzed to determine mask-specific hot spots and other design defects, process corrections, and tool matching information. The process corrections may include focus offset and changes to NA and sigma settings of the exposure tool. The simulated patterns may also be used to verify mask and OPC quality using any of the methods described above in conjunction with FIGS. 2A-2C, and to determine process windows of the lithography process.

Other embodiments of methods for creating an individual mask error model may generate systematic mask error parameters from alternative mask inspection techniques, such as atomic force microscopy, interferometric phase metrology (as described in "Optical Considerations of High-Resolution Photomask Phase Metrology," A. J. Merriam and J. J. Jacob, Proc. SPIE, Vol. 5752, 1392 (2005)), aerial image metrology (e.g., using an AIMS tool), scatterometry, and ellipsometry. Within the framework of a calibrated focus-exposure model of a lithography process (as disclosed in U.S. patent application Ser. No. 11/461,994), it is also possible to derive or verify systematic mask error parameters for an individual mask error model from SEM measurements on printed test wafers. In one embodiment, this derivation or verification is accomplished by using fitting routines that allow a variation of values of systematic mask error parameters while keeping other (separable) model components at fixed, independently determined values and by subsequently using the calibrated individual mask error model to predict mask-specific hot spots or process corrections.

An individual mask error model can be used in a wide variety of applications that go beyond OPC verification or mask qualification. For example, an individual mask error model may be used to predict mask-specific OPC hot spots or weak areas, which may be fed forward to a wafer inspection process to selectively monitor the most critical device areas. Alternatively, a simulation of a lithography process using an individual mask error model can identify process corrections that can be fed forward to device processing. These process corrections may include a wide range of adjustments of optical settings on the exposure tool such as NA, sigma, illumination profile, focus center, exposure amount, and lens adjustments. If several exposure tools are available for production, tool-specific optical models may be known from tool calibration measurements so that tool-dependent differences in printing performance may be predicted for a specific mask, and the best match can be found in order to maximize process yield by scheduling device production on that preferred tool.

Figure 8:
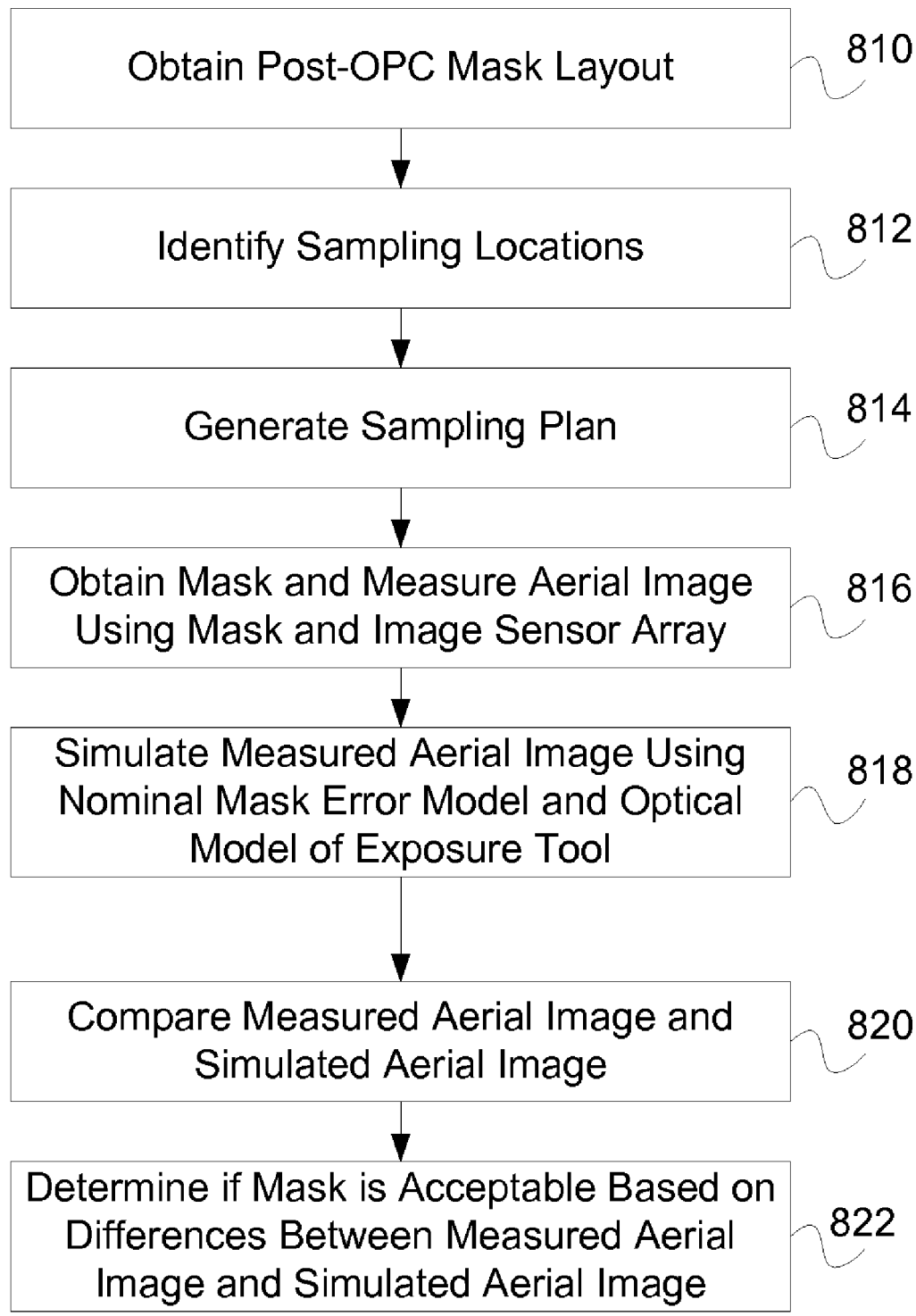
FIG. 8 is a flowchart of method steps for verifying a mask, according to one embodiment of the invention.

FIG. 8 is a flowchart of method steps for verifying a mask, according to one embodiment of the invention. In the method of FIG. 8, rather than extracting systematic mask error parameter data from mask inspection data, the expected imaging performance of a production exposure tool and a device design is defined by a post-OPC mask layout and a lithography simulation model. An aerial image produced in an exposure tool using a mask may be measured using an image sensor array at certain critical feature locations or statistically across the exposure field. Mask qualification or a pass/fail decision may then be based on an estimate of agreement between measured and simulated images, defined by suitable image processing metrics. The method of FIG. 8 may be particularly suitable if a nominal mask error model has been established for a particular mask manufacturing process (as discussed below in the conjunction with FIGS. 9-10B), and if the consistency of the mask manufacturing process may be of concern. Alternatively, the method can be used to verify mask quality over time if any aging processes or progressive defects such as haze need to be monitored.

In step 810, the post-OPC mask layout of a product is obtained. In step 812, sampling locations in the post-OPC mask layout are identified. In step 814, a sampling plan is generated for measuring an aerial image in an exposure tool using an image sensor array. In step 816, a mask manufactured according to the post-OPC mask layout is obtained and representative image patches of an aerial image produced using the mask are measured using an image sensor array according to the sampling plan. In step 818, the expected aerial image as measured by the image sensor array is simulated using a nominal mask error model and an optical model of the exposure tool and the image sensor array to produce a simulated aerial image. Then, in step 820, the measured aerial image is compared with the simulated aerial image. In step 822, a determination of whether the mask is acceptable or not is based on the differences between the measured aerial image and the simulated aerial image.

In the previous embodiments, each single instance of a mask is inspected to generate an individual mask error model for that specific mask. However, it may be sufficient in some cases to generate a nominal mask error model that is characteristic for a particular mask manufacturer or a specific mask manufacturing tool or process, instead of a particular mask. Such nominal mask error models are preferably developed and calibrated by defining test patterns on a test mask, which will not be used for printing product wafers but only for characterizing the mask manufacturing process. However, a nominal mask error model may also be developed using any mask layout data. This method is similar or somewhat analogous to process model calibration commonly used to calibrate lithography simulation models.

A clear benefit of creating a nominal mask error model for a mask manufacturing process using test patterns is the flexibility in defining suitable test pattern structures that can guarantee a complete and dense coverage of any systematic mask error parameter space. Such test patterns may for example be automatically generated by a lithography simulation system and then provided to the mask manufacturing process to create a test mask. A method of creating a nominal mask error model using test patterns is very similar as that for a product mask, however, with the simplification that no algorithm for identifying sampling locations is required since pattern types and locations are fixed and predefined in the test mask layout.

Figure 9:
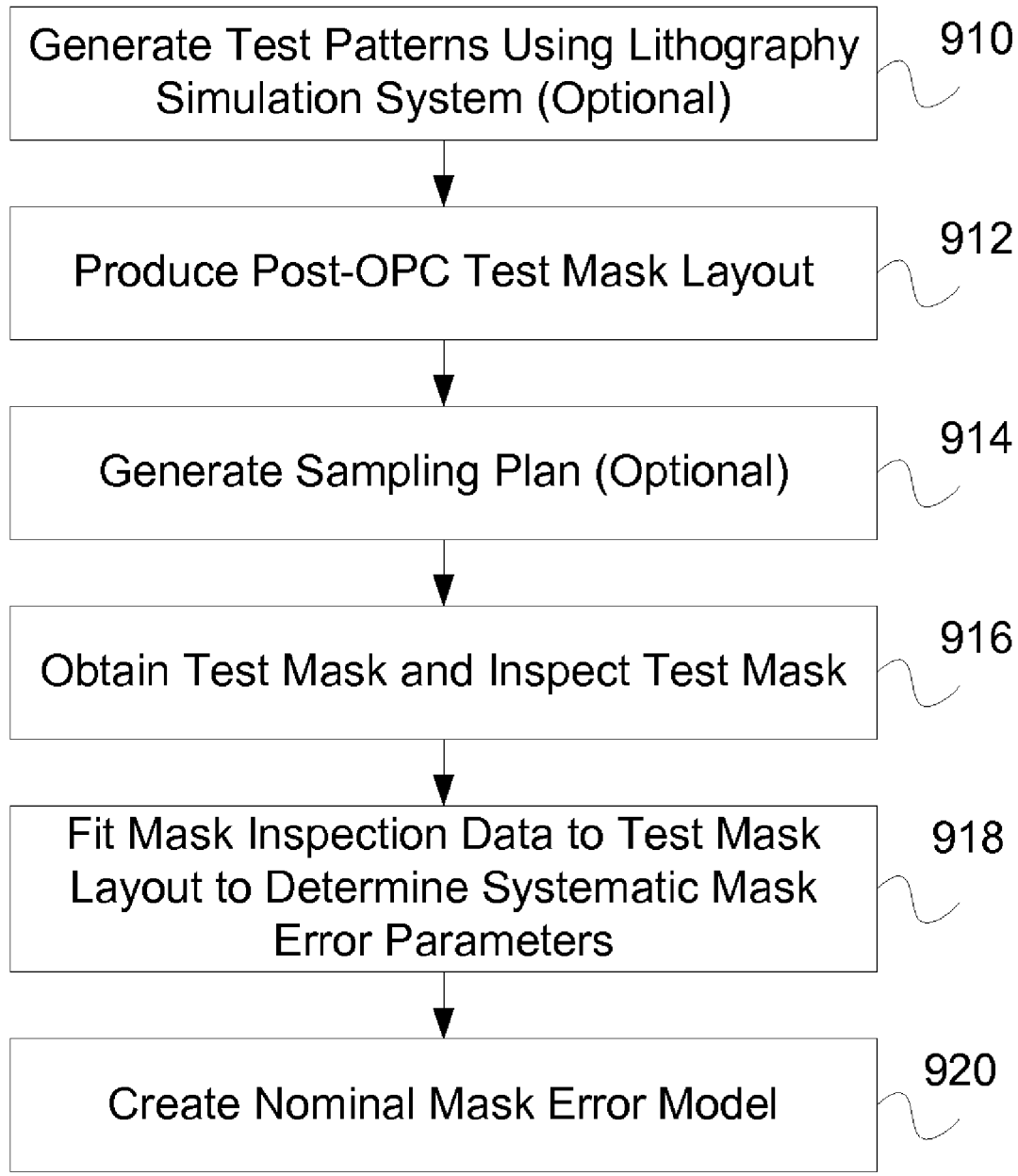
FIG. 9 is a flowchart of method steps for creating a nominal mask error model of a mask manufacturing process, according to one embodiment of the invention.

FIG. 9 is a flowchart of method steps for creating a nominal mask error model for a mask manufacturing process, according to one embodiment of the invention. In optional step 910, the test patterns for a test mask are generated by a lithography simulation system. In step 912, the test patterns are processed using OPC and other RETs to produce a post-OPC test mask layout. In optional step 914, sampling locations are determined according to the test patterns and a sampling plan is generated. In step 916, a test mask manufactured according to the post-OPC test mask layout is obtained and the test mask is inspected in a mask inspection tool according to the sampling plan, if available, to produce mask inspection data. In step 918, physical mask data are extracted from the mask inspection data and systematic mask error data are determined based on the differences between the extracted physical mask data and the post-OPC mask layout. A data fitting routine determines optimal values of systematic mask error parameters for a nominal mask error model from the systematic mask error data. The data fitting routine uses the systematic mask error parameters as fitting parameters that are optimized in order to provide the best agreement between the mask inspection data and the post-OPC mask layout. In step 920, a nominal mask error model is generated, in which the systematic mask error parameters of the nominal mask error model characterize the mask manufacturing process used to manufacture the test mask.

Figure 10A:
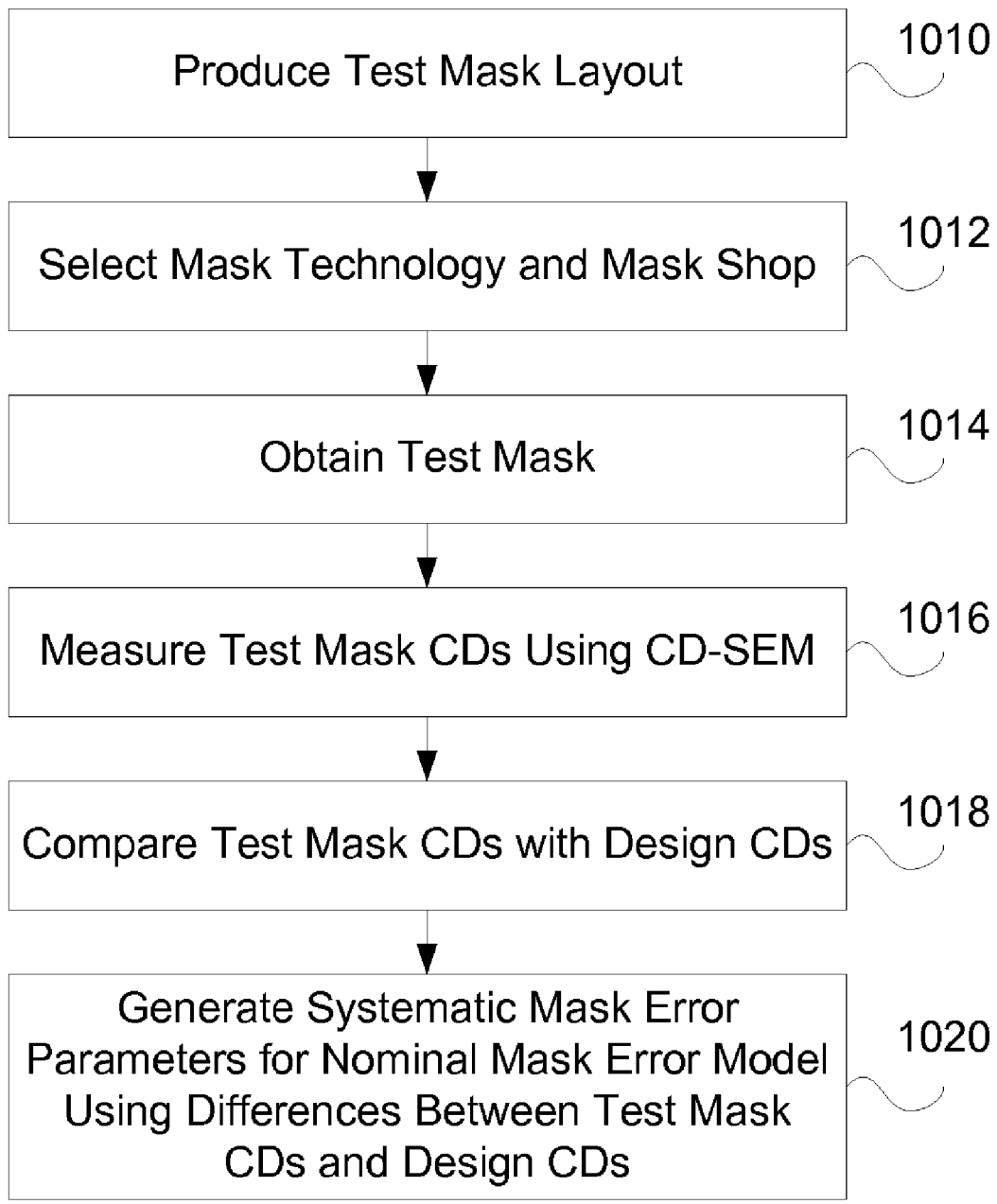
FIG. 10A is a flowchart of method steps for creating a nominal mask error model of a mask manufacturing process, according to another embodiment of the invention.

FIG. 10A is a flowchart of method steps for creating a nominal mask error model of a mask manufacturing process, according to another embodiment of the invention. In step 1010, a test mask layout with varying line widths, pitches, and orientations is produced. In step 1012, a mask technology and a mask shop to be characterized are selected. In one embodiment, a specific mask manufacturing tool is also selected. In step 1014, a test mask manufactured according to the test mask layout using the selected mask technology and mask shop is obtained. In step 1016, linewidths (CDs) on the test mask are directly measured using a CD-SEM tool. In step 1018, the measured mask CDs are compared with the design CD values through pitch across the exposure field. In step 1020, systematic mask error parameters are generated for a nominal mask error model using the systematic mask error data based on the differences between the measured mask CD values and the design CD values. The nominal mask error model is a model that can be used to characterize the selected mask shop and mask technology.

Figure 10B:
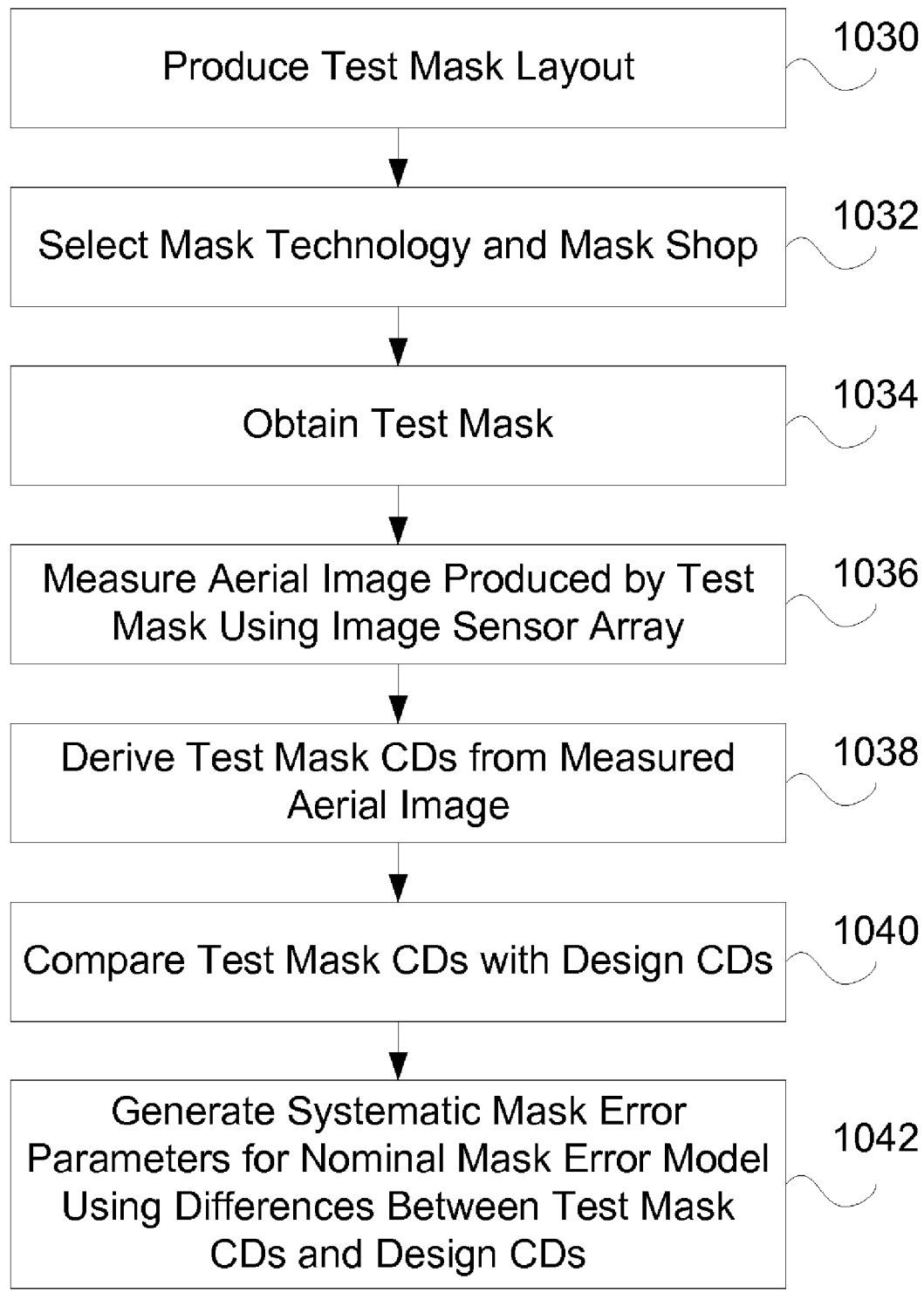
FIG. 10B is a flowchart of method steps for creating a nominal mask error model of a mask manufacturing process, according to another embodiment of the invention.

FIG. 10B is a flowchart of method steps for creating a nominal mask error model of a mask manufacturing process, according to another embodiment of the invention. In step 1030, a test mask layout with varying linewidths, pitches, and orientations is produced. In step 1032, a mask technology and a mask shop to be characterized are selected. In one embodiment, a specific mask manufacturing tool is also selected. In step 1034, a test mask manufactured according to the test mask layout using the selected mask technology and mask shop is obtained. Then, in step 1036, an aerial image produced by the test mask in an exposure tool is measured using an image sensor array. In step 1038, test mask linewidths (CDs) are extracted from the measured aerial image using an optical model of the exposure tool. In step 1040, the derived test mask CD values are compared with the design CD values through pitch across the exposure field. In step 1042, systematic mask error parameters are generated for a nominal mask error model using the systematic mask error data based on the differences between the derived test mask CD values and the design CD values. The nominal mask error model is a model that can be used to characterize the selected mask shop and mask technology.

The invention has been described above with reference to specific embodiments. It will, however, be evident that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A method comprising:
    obtaining mask inspection data from a mask manufactured using mask layout data and a mask inspection tool configured to produce mask inspection data;
    determining differences between the mask inspection data and the mask layout data;
    generating systematic mask error data based on the differences between the mask inspection data and the mask layout data using a model-based mask data analysis system configured to extract physical mask data from the mask inspection data; and
    generating systematic mask error parameters for an individual mask error model based on the systematic mask error data.

2. The method of claim 1, further comprising:
    simulating a lithography process using the individual mask error model having the systematic mask error parameters to produce simulated results; and
    analyzing the simulated results to evaluate a process window of the lithography process.

3. The method of claim 1, further comprising:
    simulating a lithography process using the individual mask error model having the systematic mask error parameters to produce simulated results; and
    analyzing the simulated results to verify the mask.

4. The method of claim 1, further comprising:
    simulating a lithography process using the individual mask error model having the systematic mask error parameters to produce simulated results; and comparing the simulated results to a design target.

5. The method of claim 1, further comprising:
    simulating a lithography process using the individual mask error model having the systematic mask error parameters to produce simulated results;
    simulating the lithography process using a nominal mask error model to produce nominal simulated results; and
    comparing the simulated results and the nominal simulated results to verify the mask.

6. The method of claim 1, further comprising:
    simulating a lithography process using the individual mask model having the systematic mask error parameters to produce simulated results;
    simulating the lithography process using a post optical proximity correction (OPC) mask layout to produce ideal simulated results; and
    comparing the simulated results and the ideal simulated results to verify the mask.

7. The method of claim 1, wherein the systematic mask error parameters are selected from the group consisting of linewidth bias, phase bias, corner rounding radii, line-edge roughness, etch depth, and sidewall angle.

8. The method of claim 1, wherein the mask inspection data is obtained by directly measuring pattern metrics of the mask using a metrology tool selected from the group consisting of a critical dimension scanning electron microscope (CD-SEM) tool, an imaging scanning electron microscope (SEM) tool, an atomic force microscope (AFM) tool, an optical microscope, a phase-shifting interferometer, and an ellipsometer.

9. The method of claim 1, wherein the mask inspection data is obtained by determining pattern metrics of an aerial image produced by an exposure tool and the mask using an image sensor array disposed in the exposure tool.

10. The method of claim 1, wherein the mask inspection data is obtained by determining pattern metrics of the mask using an inspection tool selected from the group consisting of an optical mask inspection tool, an electron beam mask inspection tool, and an aerial image measurement system.

11. The method of claim 1, wherein the mask layout data is circuit design data.

12. The method of claim 1, wherein the mask layout data is test pattern data.

13. A system comprising:
    a mask inspection tool configured to produce mask inspection data;
    a model-based mask data analysis system coupled to the mask inspection tool, the model-based mask data analysis system configured to extract physical mask data from the mask inspection data, to determine systematic mask error data based on differences between the extracted physical mask data and mask layout data, and configured to generate systematic mask error parameters for an individual mask error model based on the systematic mask error data.

14. The system of claim 13, wherein the systematic mask error parameters are selected from the group consisting of linewidth bias, phase bias, corner rounding radii, line-edge roughness, etch depth, and sidewall angle.

15. The system of claim 13, wherein the mask inspection tool is selected from the group consisting of a critical dimension scanning electron microscope (CD-SEM) tool, an imaging scanning electron microscope (SEM) tool, an atomic force microscope (AFM) tool, an optical microscope, a phase-shifting interferometer, and an ellipsometer.

16. The system of claim 13, wherein the mask inspection tool is an image sensor array disposed in an exposure tool.

17. The system of claim 14, wherein the mask inspection tool is selected from the group consisting of an optical mask inspection tool, an electron beam mask inspection tool, and an aerial image measurement system.

* * * * *